(12) United States Patent
Yoshizawa et al.

(10) Patent No.: US 6,323,738 B1
(45) Date of Patent: Nov. 27, 2001

(54) VOLTAGE-CONTROLLED RING OSCILLATOR WITH LEVEL CONVERTING AND AMPLITUDE CONTROL CIRCUITS

(75) Inventors: Akihiko Yoshizawa, Yokohama; Shuichi Takada, Kawasaki, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/604,721

(22) Filed: Jun. 28, 2000

(30) Foreign Application Priority Data

Jun. 30, 1999 (JP) .................................................. 11-186326

(51) Int. Cl.$^7$ ................................. H03B 5/02; H03L 5/00
(52) U.S. Cl. .............................. 331/57; 331/75; 331/109; 331/183; 331/177 R
(58) Field of Search ......................... 331/57, 109, 177 R, 331/183, 74, 75

(56) References Cited

U.S. PATENT DOCUMENTS

| | | | |
|---|---|---|---|
| 5,142,249 | * 8/1992 | Hirotomi | 331/57 |
| 5,412,349 | 5/1995 | Young et al. | 331/34 |
| 5,594,391 | 1/1997 | Yoshizawa | 331/57 |
| 5,619,170 | * 4/1997 | Nakamura | 331/57 |
| 5,748,048 | 5/1998 | Moyal | 331/34 |
| 5,896,068 | 4/1999 | Moyal | 331/34 |
| 5,909,474 | 6/1999 | Yoshizawa | 375/376 |

* cited by examiner

*Primary Examiner*—Siegfried H. Grimm
(74) *Attorney, Agent, or Firm*—Finnegan, Henderson, Farabow, Garrett & Dunner, L.L.P.

(57) ABSTRACT

A voltage-controlled oscillator comprises a level converting circuit, an amplitude controller, a voltage-controlled oscillation section having differential delay cells connected in a ring form, and an output level converting circuit. The level converting circuit has limiters which respectively limit a maximum value and a minimum value of a control current. Those limiters permit only a region where the voltage-controlled oscillation section properly performs its oscillating operation to be used.

27 Claims, 10 Drawing Sheets

VOLTAGE-CONTROLLED RING OSCILLATOR WITH LEVEL CONVERTING AND AMPLITUDE CONTROL CIRCUITS

CROSS-REFERENCE TO RELATED APPLICATIONS

This application is based upon and claims the benefit of priority from the prior Japanese Patent Application No. 11-186326, filed Jun. 30, 1999, the entire contents of which are incorporated herein by reference.

BACKGROUND OF THE INVENTION

The present invention relates to a voltage-controlled oscillator (VCO), and, more particularly, to a ring type voltage-controlled oscillator which uses a plurality of differential delay cells and which is used to generate a high-frequency clock signal for the internal circuits of an LSI, such as a micro computer (MCU: Micro Control Unit) or a digital signal processor (DSP). This voltage-controlled oscillator is adapted to various applications to improve the processing performance of an LSI and suppress the overall power of a system by using a low-frequency clock for an external clock of the LSI and a high-frequency clock for an internal clock of the LSI.

FIG. 1 shows a conventional fundamental voltage-controlled oscillator which uses a plurality of differential delay cells. This oscillator includes a level converting circuit and amplitude controller 1, differential delay cells 2 to 6, which constitute a voltage-controlled oscillation section 100, and an output level converting circuit 7. The delay cells 2 to 6 have the same circuit structure which comprises PMOS (P channel MOS) transistors P1 and P2 and NMOS (N channel MOS) transistors N1 to N3. The voltage-controlled oscillator performs its oscillating operation as the differential output signals of the first-stage delay cell 2 are sequentially supplied to the subsequent stages of delay cells 3, 4 and 5 and the differential output signals, Vip and Vim, of the last-stage delay cell 6 are supplied to the output level converting circuit 7 and are fed back to the gates of the NMOS transistors N2 and N1 in the first-stage delay cell 2. An amplitude control voltage Vbp output from the level converting circuit and amplitude controller 1 is supplied to the gates of the PMOS transistors P1 and P2 in each of the delay cells 2–6, and a control voltage Vcn output from the level converting circuit and amplitude controller 1 is supplied to the gate of the NMOS transistor N3, thereby controlling the oscillating operation. The output level converting circuit 7 outputs a clock signal CKout. Note that the level converting circuit and amplitude controller 1, the delay cells 2–6 and the output level converting circuit 7 operate on power supply voltages VDD and VSS.

FIG. 2 exemplifies the structure of a level converting circuit 1A in the circuit shown in FIG. 1, FIG. 3 exemplifies the structure of an amplitude controller 1B in the circuit shown in FIG. 1 and FIG. 4 exemplifies the structure of the output level converting circuit 7 in the circuit shown in FIG. 1.

As shown in FIG. 2, the level converting circuit 1A comprises PMOS transistors P3 and P4, NMOS transistors N4 and N5 and a resistor R1. This circuit 1A performs voltage/current conversion of a control voltage Vin input externally and then performs current/voltage conversion to generate the control voltage Vcn. The control voltage Vin is supplied to the gate of the NMOS transistor N4 and the control voltage Vcn is output from a common node between the drains of the PMOS transistor P4 and the NMOS transistor N5.

The amplitude controller 1B shown in FIG. 3 comprises a reference voltage generator 8, an operational amplifier 9 and an amplitude-control target circuit 101. The amplitude-control target circuit 101 comprises PMOS transistors P5 and P6 and NMOS transistors N6 to N8. A reference voltage Vref output from the reference voltage generator 8 is supplied to the inverting input terminal (−) of the operational amplifier 9 and the gate of the NMOS transistor N7. The control voltage Vcn that is output from the level converting circuit 1A is supplied to the gate of the NMOS transistor N8. The output of the operational amplifier 9 is supplied to the gates of the PMOS transistors P5 and P6 and is output as the amplitude control voltage Vbp.

As shown in FIG. 4, the output level converting circuit 7 comprises PMOS transistors P7 to P9 and NMOS transistors N9 to N12. The output signal Vim of the delay cell 6 is supplied to the gate of the NMOS transistor N9, and the output signal Vip to the gate of the NMOS transistor N10. The clock signal CKout is acquired from a common node between the drains of the PMOS transistor P9 and the NMOS transistor N12.

With the above structure, the control voltage Vin is input to the level converting circuit 1A where it is converted to the control voltage Vcn according to a control current Icnt of the delay cells 2–6. In the amplitude controller 1B, the amplitude-control target circuit 101 has the same structure as the delay cells 2–6 and the supply voltage VDD is applied to one input terminal (the gate of the NMOS transistor N6) of the amplitude-control target circuit 101 while the reference voltage Vref generated by the reference voltage generator 8 is applied to the other input terminal (the gate of the NMOS transistor N7). An output voltage from an output terminal 102 of the amplitude-control target circuit 101 on that side where the power supply voltage VDD is input and the reference voltage Vref generated by the reference voltage generator 8 are respectively input to the non-inverting input terminal (+) and the inverting input terminal (−) of the operational amplifier 9 whose output is sent out as the amplitude control voltage Vbp. As this amplitude control voltage Vbp is applied to the gates of the PMOS transistors P5 and P6 in the amplitude-control target circuit 101, feedback control is carried out to make the output voltage from the output terminal 102 equal to the reference voltage Vref generated by the reference voltage generator 8. This indicates that as the amplitude control voltage Vbp is input to the voltage-controlled oscillation section 100 comprising the delay cells 2–6 which have the same circuit structure as that of the amplitude-control target circuit 101, the output voltage output from the output terminal of the voltage-controlled oscillation section 100 becomes the same as the reference voltage Vref generated by the reference voltage generator 8 when the voltage at one input terminal of each of the delay cells 2–6 has the level of the power supply voltage VDD.

Therefore, the amplitude of the oscillation waveform of this voltage-controlled oscillation section 100 is always kept constant by the amplitude control voltage Vbp so that the maximum value of the oscillation waveform becomes the power supply voltage VDD and the minimum value becomes the reference voltage Vref generated by the reference voltage generator 8.

Further, as the control voltage Vcn which controls the oscillation frequency of the voltage-controlled oscillation section 100 is also input to the amplitude-control target circuit 101, the amplitude control voltage Vbp changes in accordance with a change in control voltage Vcn. Even if the oscillation frequency of the voltage-controlled oscillation section 100 changes, therefore, the amplitude of the oscillation waveform of the voltage-controlled oscillation section 100 is always kept constant by the amplitude control voltage Vbp so that the maximum value of the oscillation waveform becomes the power supply voltage VDD and the minimum value becomes the reference voltage Vref generated by the reference voltage generator 8. As a result, the oscillation output as shown in FIG. 5 is acquired. FIG. 5 shows the oscillation waveform of the voltage-controlled oscillation section 100 which comprises small-amplitude differential delay cells whose output amplitude is controlled to the level of the power supply voltage VDD from the level of the reference voltage Vref.

As apparent from the above, the small-amplitude output of the voltage-controlled oscillation section 100 is supplied to the output level converting circuit 7 where its level is converted to the CMOS level of the power supply voltage VDD from the level of the ground voltage VSS that is used in a CMOS logic circuit, and the resultant signal is output as the clock signal CKout.

The use of the above-described differential delay cells is advantageous in two features of the delay cells. One is that the delay cells insusceptible to common-mode noise, such as noise in the voltage supply, and the other is that the delay cells are suitable for a high-frequency operation.

The insusceptibility to noise is regarded as one of important circuit techniques for analog circuits which are invulnerable to digital noise that is generated in a digital circuit in the mixed signalization (mixed integration of an analog circuit and a digital circuit on the same chip) in the recent large scale integrated circuits (LSIs). As microfabrication or the like of devices makes the gate delay of transistors smaller, there is a tendency of using a high-frequency clock for the internal clock of an LSI in order to enhance the signal processing performance of the LSI. The second feature, the suitability for a high-frequency operation, is therefore convenient to that recent tendency. In this respect, a voltage-controlled oscillator which generates this internal clock is demanded to have a high oscillation frequency.

The oscillation frequency, fosc, of a voltage-controlled oscillator is given by $$fosc=1/(N \times Tdelay)$$

where N is the number of stages of delay cells and Tdelay is the delay time per delay-cell stage.

The delay time Tdelay is given by $$Tdelay=Co \times Vo/Icnt$$

where Co is the output load capacitance of a delay cell, Vo is the output amplitude of the delay cell and Icnt is the control current which controls the delay time of the delay cell.

The oscillation frequency of the voltage-controlled oscillation section 100 can be increased by reducing the number of stages N of delay cells or shortening the delay time Tdelay per delay-cell stage. If the number of stages N of delay cells is small, a variation in delay time from one delay-cell stage to another may directly affect the oscillation frequency that is produced in the voltage-controlled oscillation section 100. Reducing the number of stages N of delay cells is not deemed very preferable from the viewpoint of the stability of the oscillation frequency produced in the voltage-controlled oscillation section 100.

The output load capacitance Co of a delay cell is the gate capacitance of the input transistor of the next stage of a delay cell and is a parameter which depends on the miniaturization of processes. The maximum value of the control current Icnt for controlling the delay time of a delay cell depends on the size of transistors in use, so that increasing the size of the transistors to increase the control current Icnt makes the output load capacitance Co of the delay cell higher. Therefore, the control current Icnt that controls the delay time of a delay cell seems to have an optimal value according to the process miniaturization.

From the above, circuit-based schemes which can increase the oscillation frequency of the voltage-controlled oscillation section 100 without depending on the process miniaturization are the reduction in the number of delay-cell stages N and the lowering the output amplitude Vo of delay cells.

While lowering the output amplitude Vo of delay cells is effective in increasing the oscillation frequency of the voltage-controlled oscillation section 100, it reduces the S/N ratio, which requires the use of differential delay cells to enhance the performance to noise. It is also necessary to keep the output amplitude of the voltage-controlled oscillation section 100 constant as well as keep the center voltage (the voltage at which the non-inverted output and the inverted output cross each other) constant in consideration of the operational characteristics of the output level converting circuit 7 which converts the level of the small-amplitude output of the voltage-controlled oscillation section 100 to the CMOS level.

If the output amplitude and the center voltage of the voltage-controlled oscillation section 100 are not kept constant, the proper operation of the output level converting circuit 7 which converts the level of the small-amplitude output of the voltage-controlled oscillation section 100 to the CMOS level becomes difficult, thus impairing the stability of the duty and frequency of the clock signal CKout output from the output level converting circuit 7. Further, the output level converting circuit 7 may become inoperable so that the clock signal CKout cannot be output.

The amplitude controller 1B as shown in FIG. 3 whose amplitude-control target circuit 101 uses the same circuit structure as the delay cells that constitute the voltage-controlled oscillation section 100 works effectively to some extent to ensure the proper operation of the output level converting circuit 7 which converts the level of the small-amplitude output of the voltage-controlled oscillation section 100 to the CMOS level. While the voltage-controlled oscillation section 100 and the amplitude controller 1B use the same delay cells, the following problem arises due to the difference in operational state between them.

Because of the nature of the oscillating operation, the voltage-controlled oscillation section 100 always performs an AC operation in which an "H" level (the level of the power supply voltage VDD) and an "L" level (the level of the reference voltage Vref) repeat alternately. By way of contrast, the amplitude controller 1B performs a DC operation in which the input voltages are always fixed to the "H" level (the level of the power supply voltage VDD) and the "L" level (the level of the reference voltage Vref). The difference in operational state between the AC operation and the DC operation is negligible when the oscillation frequency of the voltage-controlled oscillation section 100 is low, but becomes prominent as this oscillation frequency gets higher. When the oscillation frequency of the voltage-controlled oscillation section 100 is low, the time in which the oscillation frequency is stable at the "H" level and the "L" level is long as shown in FIG. 6A, so that "H" level and the "L" level reach the desired levels to ensure the stable operation as done in the amplitude controller 1B. As the oscillation frequency of the voltage-controlled oscillation section 100 becomes higher, however, the time in which the oscillation frequency is stable at the "H" level and the "L" level becomes shorter as shown in FIG. 6B. This raises such a problem that the operation goes to the next cycle before the output amplitude reaches the desired level, thus making the output amplitude lower (the lower limit Vbottom of the output amplitude becoming higher than the reference voltage Vref) or such a problem that the level of the center voltage of the output amplitude varies.

Those two problems degrade the linearity of the conversion characteristics of the voltage and frequency of the voltage-controlled oscillation section 100 and make difficult the proper operation of the output level converting circuit 7 which converts the level of the small-amplitude output of the voltage-controlled oscillation section 100 to the CMOS level. This deteriorates the stability of the duty and frequency of the clock signal CKout output from the output level converting circuit 7. Further, the output level converting circuit 7 may become disabled so that the clock signal CKout cannot be output. The disabling of the output of the clock signal CKout is critical because it disables the feedback control in a PLL (Phase Locked Loop) circuit and puts the PLL circuit in an unrecoverable state.

Therefore, the prior art needs to take some design measures, such as a design which does not make the oscillation frequency of the voltage-controlled oscillation section 100 higher by increasing the number of stages of delay cells of the voltage-controlled oscillation section 100. From the view point of application, the conventional voltage-controlled oscillator cannot be used in a high-frequency range and thus suffers a narrow frequency range, which limits the range of application systems and puts restrictions on the usage of the voltage-controlled oscillator.

BRIEF SUMMARY OF THE INVENTION

Accordingly, it is an object of the present invention to provide a voltage-controlled oscillator which can output a clock signal with a stable and precise oscillation frequency over a wide range from a low-frequency area to a high-frequency area by controlling the output amplitude of its voltage-controlled oscillation section to a constant level even when the oscillation frequency of the voltage-controlled oscillation section becomes high.

It is another object of this invention to provide a voltage-controlled oscillator whose oscillation frequency can vary over a wide range so that the oscillator can be adapted to various application systems.

To achieve the above objects, there is provided a voltage-controlled oscillator that uses a level converting circuit which includes a V/I converting section for converting an input control voltage to a control current for controlling a voltage-controlled oscillation section; a first limiter for limiting a maximum value of the control current with respect to the converted current; a second limiter for limiting a minimum value of the control current; and a constant current source for generating a reference current for the first and second limiters.

To achieve the above objects, there is provided a voltage-controlled oscillator having a voltage-controlled oscillation section and an amplitude controller for controlling an amplitude of a signal output from the voltage-controlled oscillation section, the voltage-controlled oscillation section having a plurality of differential delay cells connected in a ring form, each of the differential delay cells including first amplitude control means, first V/I converting means having an input terminal to which a differential signal is input, and first current control means to which an output current of the first V/I converting means is commonly supplied, the amplitude controller including an amplitude-control target circuit having second amplitude control means, second V/I converting means whose input terminal is applied with a supply voltage and which is controlled by an output of the second amplitude control means, and second current control means to which an output current of the second V/I converting means is supplied, a reference voltage generator for generating and outputting a reference voltage for amplitude control, and an operational amplifier for receiving the reference voltage output from the reference voltage generator and an output voltage of the amplitude-control target circuit and outputting a control voltage for controlling the first amplitude control means in the differential delay cells and the second amplitude control means in the amplitude-control target circuit in such a way that a potential difference between the reference voltage and the output voltage becomes zero, wherein a difference between a lower limit of an oscillation amplitude of the differential delay cells which are performing an AC operation and the output voltage of the amplitude-control target circuit which is performing a DC operation is corrected by the control voltage output from the operational amplifier.

The objects of this invention are achieved by a voltage-controlled oscillator comprising a voltage-controlled oscillation section and an amplitude controller for controlling an amplitude of a signal output from the voltage-controlled oscillation section, the voltage-controlled oscillation section having a plurality of differential delay cells connected in a ring form, each of the differential delay cells including a first amplitude control section, first and second V/I converting sections having input terminals to which differential signals are input, and a first current control section to which output currents of the first and second V/I converting sections are commonly supplied, the amplitude controller including an amplitude-control target circuit having a second amplitude control section, a third V/I converting section whose input terminal is applied with a supply voltage and which is controlled by an output of the second amplitude control section, a fourth V/I converting section whose input terminal is supplied with an output voltage of the third V/I converting section and which is controlled by the output of the second amplitude control section, and a second current control section to which output currents of the third and fourth V/I converting sections are commonly supplied and whose current value is equal to that of the first current control section, a reference voltage generator for generating and outputting a reference voltage for amplitude control, and an operational amplifier for receiving the reference voltage output from the reference voltage generator and an output voltage of the amplitude-control target circuit and outputting a control voltage for controlling the first amplitude control sections in the differential delay cells and the second amplitude control section in the amplitude-control target circuit in such a way that a potential difference between the reference voltage and the output voltage becomes zero, wherein a transconductance of the second amplitude control section of the amplitude-control target circuit is greater than a transconductance of the first amplitude control sections of the differential delay cells constituting the voltage-controlled oscillation section with respect to the same control voltage output from the operational amplifier.

The objects of this invention are also achieved by a voltage-controlled oscillator comprising a voltage-controlled oscillation section having a plurality of differential delay cells connected in a ring form, and an amplitude controller for controlling an amplitude of a signal output from the voltage-controlled oscillation section, the amplitude controller including an amplitude-control target circuit, a reference voltage generator for generating and outputting a reference voltage for amplitude control, and an operational amplifier for receiving the reference voltage output from the reference voltage generator and an output voltage of the amplitude-control target circuit and outputting a control voltage for controlling amplitude control sections in the differential delay cells and an amplitude control section in the amplitude-control target circuit in such a way that a potential difference between the reference voltage and the output voltage becomes zero, each of the differential delay cells having a first amplitude control section and a first current control section and a pair of first and second V/I converting sections connected between the first amplitude control section and the first current control section, differential signals being input to input terminals of the first and second V/I converting sections, the amplitude-control target circuit having a second amplitude control section and a second current control section and a single third V/I converting section connected between the second amplitude control section and the second current control section, a supply voltage being input to an input terminal of the third V/I converting section.

The objects of this invention are further achieved by a voltage-controlled oscillator comprising a voltage-controlled oscillation section and an amplitude controller for controlling an amplitude of a signal output from the voltage-controlled oscillation section, the voltage-controlled oscillation section having a plurality of differential delay cells connected in a ring form, each of the differential delay cells including a first amplitude control section, first and second V/I converting sections having input terminals to which differential signals are input, and a first current control section to which output currents of the first and second V/I converting sections are commonly supplied, the amplitude controller including an amplitude-control target circuit having a second amplitude control section, a third V/I converting section whose input terminal is applied with a supply voltage and which is controlled by an output of the second amplitude control section, and a second current control section to which an output current of the third V/I converting section is supplied and whose current value is smaller than a current value of the first current control section and greater than ½ thereof, a reference voltage generator for generating and outputting a reference voltage for amplitude control, and an operational amplifier for receiving the reference voltage output from the reference voltage generator and an output voltage of the amplitude-control target circuit and outputting a control voltage for controlling the first amplitude control sections in the differential delay cells and the second amplitude control section in the amplitude-control target circuit in such a way that a potential difference between the reference voltage and the output voltage becomes zero, wherein a transconductance of the first amplitude control sections of the differential delay cells constituting the voltage-controlled oscillation section is substantially equal to a transconductance of the second amplitude control section of the amplitude-control target circuit with respect to the same control voltage output from the operational amplifier.

Further, the objects of this invention are achieved by a voltage-controlled oscillator comprising a voltage-controlled oscillation section and an amplitude controller for controlling an amplitude of a signal output from the voltage-controlled oscillation section, the voltage-controlled oscillation section having a plurality of differential delay cells connected in a ring form, each of the differential delay cells including a first amplitude control section, first and second V/I converting sections having input terminals to which differential signals are input, and a first current control section to which output currents of the first and second V/I converting sections are commonly supplied, the amplitude controller including an amplitude-control target circuit having a second amplitude control section, a third V/I converting section whose input terminal is applied with a supply voltage and which is controlled by an output of the second amplitude control section, and a second current control section to which an output current of the third V/I converting section is supplied and whose current value is substantially ½ of a current value of the first current control section, a reference voltage generator for generating and outputting a reference voltage for amplitude control, and an operational amplifier for receiving the reference voltage output from the reference voltage generator and an output voltage of the amplitude-control target circuit and outputting a control voltage for controlling the first amplitude control sections in the differential delay cells and the second amplitude control section in the amplitude-control target circuit in such a way that a potential difference between the reference voltage and the output voltage becomes zero, wherein a transconductance of the second amplitude control section of the amplitude-control target circuit is smaller than a transconductance of the first amplitude control sections of the differential delay cells constituting the voltage-controlled oscillation section with respect to the same control voltage output from the operational amplifier.

Furthermore, the objects of this invention are achieved by a voltage-controlled oscillator that uses an output level converting circuit which includes a small-amplitude output and low-gain input differential stage for receiving and amplifying a small-amplitude output signal of a voltage-controlled oscillation section comprised of differential delay cells; an output level adjusting circuit for adjusting a DC level of an output of the small-amplitude output and low-gain input differential stage; a common-mode feedback amplifying stage for receiving an output of the small-amplitude output and low-gain input differential stage whose output level has been adjusted and amplifying the received output to an output of a CMOS level; and a CMOS buffer amplifying stage for receiving an output of the common feedback amplifying stage and outputting a waveform-shaped output signal.

With the above structures, the level converting circuit includes limiters for limiting the maximum value Imax and minimum value Imin of the control current. Those limiters can make usable only the region where the voltage-controlled oscillation section properly performs its oscillating operation, thereby improving the stability of the duty and frequency of the clock signal that is output from the voltage-controlled oscillator.

As the delay cells used in the voltage-controlled oscillation section have the same circuit structure as that of the delay cell that is used in the amplitude-control target circuit in the amplitude controller and the amplitude controller performs such control as to make the lowest point of the output voltage of the delay cells in the voltage-controlled oscillation section equal to the reference voltage (Vref−α) in a low-frequency operation area. This prevents the oscillation amplitude of the voltage-controlled oscillation section from becoming smaller in a high-frequency operation area, and can ensure the proper operation of the output level converting circuit which converts the level of the small-amplitude output of the voltage-controlled oscillation section to the CMOS level, thereby improving the stability of the duty and frequency of the clock signal that is output from the output level converting circuit.

Further, even if the output amplitude of the voltage-controlled oscillation section or the center voltage of the output amplitude varies, the amplitude and duty of the output waveform of the output level converting circuit are not affected by those variations, so that the output level converting circuit can perform a stable operation.

The use of the level converting circuit, the amplitude controller and the output level converting circuit of this invention can therefore ensure such control as to make the output amplitude of the voltage-controlled oscillation section constant in the operational frequency range of the voltage-controlled oscillation section. This can allow an accurate oscillation frequency with a stable duty and frequency to be output over a wide range from the low-frequency area to the high-frequency area. It is therefore possible to widen the variable range of the oscillation frequency of the voltage-controlled oscillator and make the voltage-controlled oscillator adaptable to various application systems.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

FIRST EMBODIMENT

Figure 1:
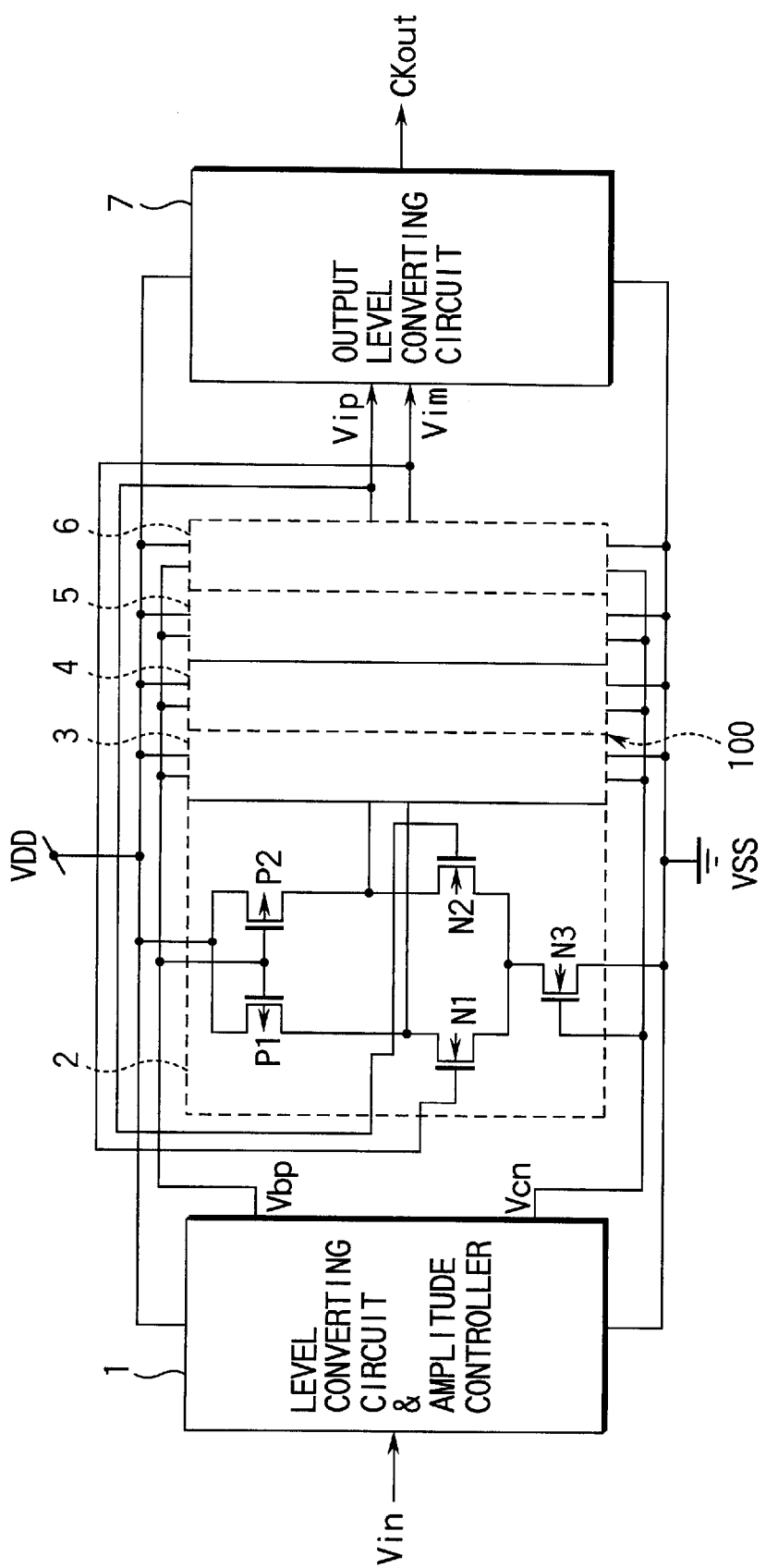
FIG. 1 is a circuit diagram showing a conventional fundamental voltage-controlled oscillator which uses a plurality of differential delay cells.
Figure 2:
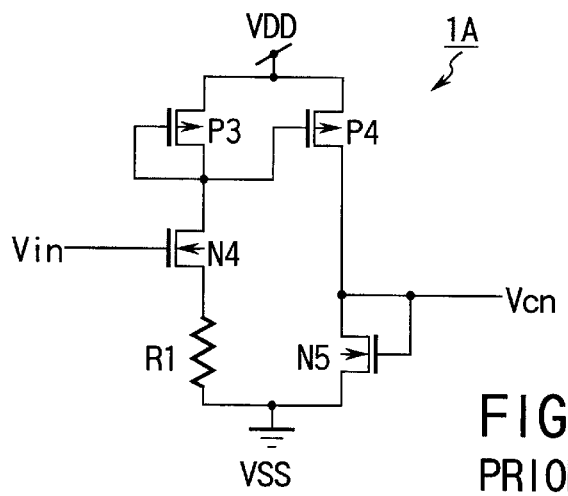
FIG. 2 is a circuit diagram exemplifying the structure of a level converting circuit in the circuit shown in FIG. 1.
Figure 3:
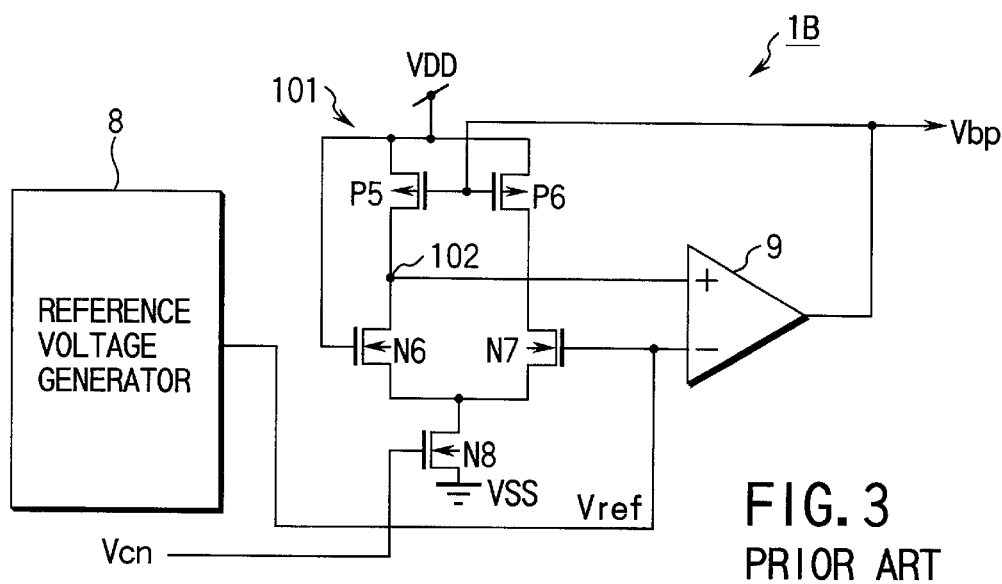
FIG. 3 is a circuit diagram exemplifying the structure of an amplitude controller in the circuit shown in FIG. 1.
Figure 4:
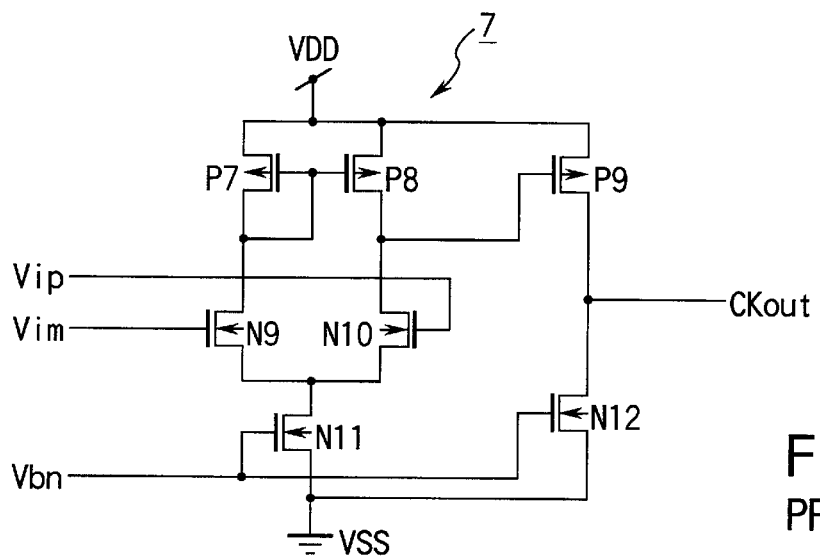
FIG. 4 is a circuit diagram exemplifying the structure of an output level converting circuit in the circuit shown in FIG. 1.
Figure 5:
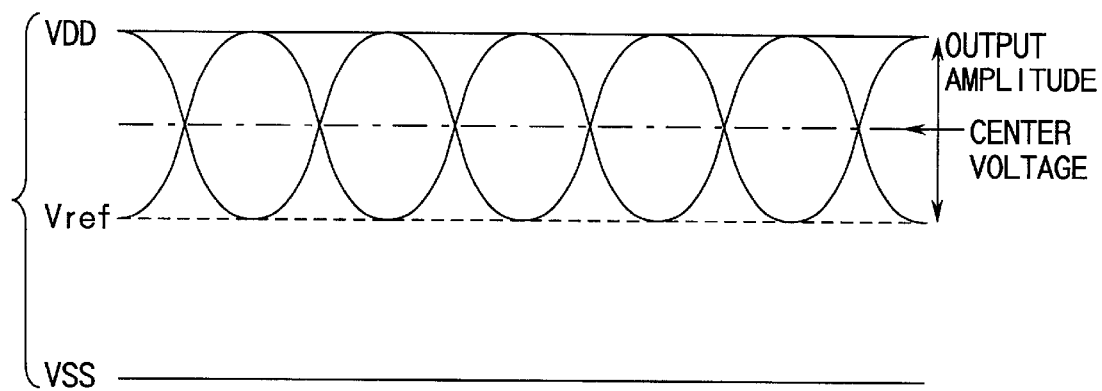
FIG. 5 is a waveform diagram illustrating oscillation waveforms of a voltage-controlled oscillation section which comprises small-amplitude differential delay cells whose output amplitude is controlled between a reference voltage and a supply voltage.
Figure 6A:
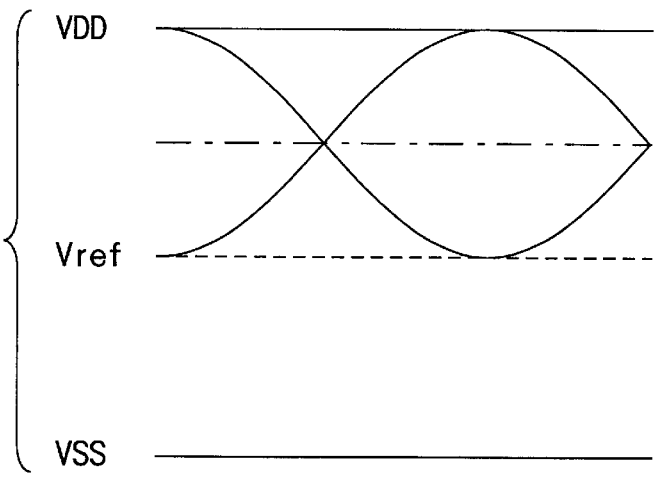
FIG. 6A is a waveform diagram for explaining the oscillating operation of the voltage-controlled oscillation section when the oscillation frequency is low.
Figure 6B:
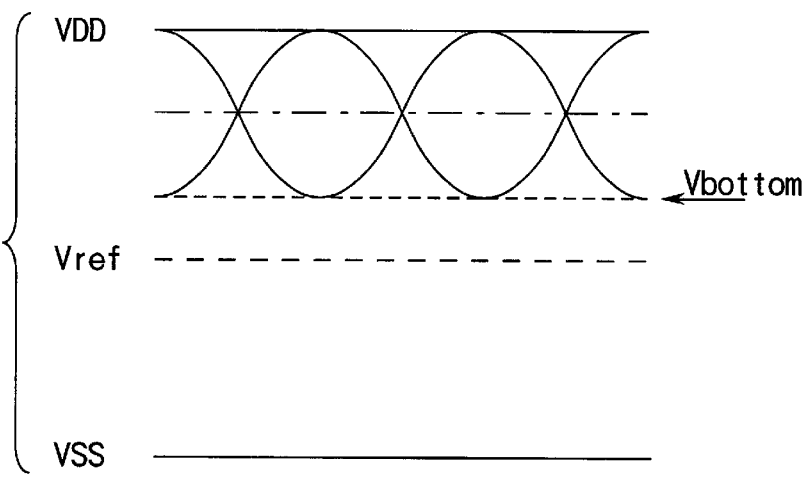
FIG. 6B is a waveform diagram for explaining the oscillating operation of the voltage-controlled oscillation section when the oscillation frequency is high.
Figure 7:
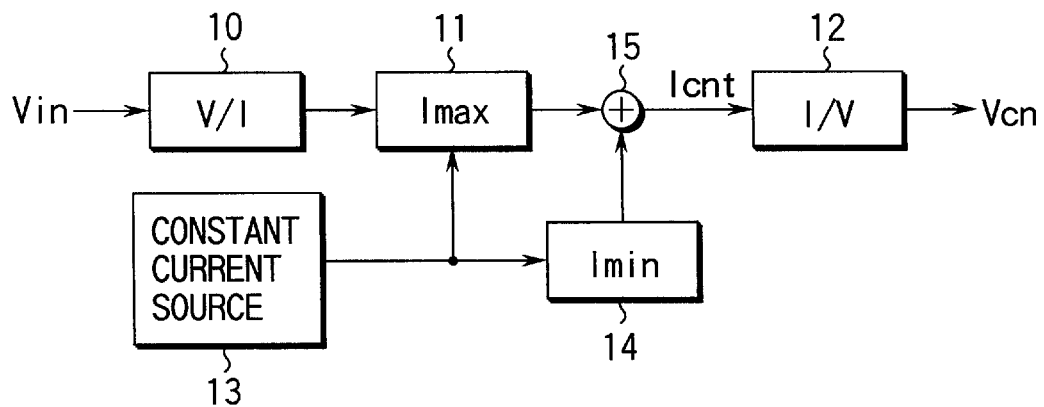
FIG. 7 is a conceptual diagram for explaining a voltage-controlled oscillator according to a first embodiment of this invention, showing a level converting circuit which is used in the voltage-controlled oscillator.

FIG. 7 is a conceptual diagram for explaining a voltage-controlled oscillator according to the first embodiment of this invention and shows a level converting circuit which is used in the voltage-controlled oscillator. This level converting circuit includes a V/I converting section 10 for converting an input voltage Vin to a current, a constant current source 13, an Imax limiting section (first limiter) 11 for limiting the maximum value of the output current to or below a desired value with respect to the current value of the constant current source 13, an Imin limiting section (second limiter) 14 for limiting the minimum value of the output current to or above a desired value based on the current value of the constant current source 13, an adding section 15 which adds the output current of the Imax limiting section 11 and the output current of the Imin limiting section 14 to generate a control current Icnt, and an I/V converting section 12 which converts the control current Icnt to a voltage to thereby generate a control voltage Vcn.

The value Imax is selected to be a control current value which does not exceed whichever is lower, the maximum oscillation frequency of the voltage-controlled oscillation section or the maximum operational frequency of the output level converting circuit, and the value Imin is selected to be a control current value which does not get lower than whichever is higher, the minimum oscillation frequency of the voltage-controlled oscillation section or the minimum operational frequency of the output level converting circuit. The value Imax and the value Imin can be set separately. This can limit the usable frequency range of the voltage-controlled oscillation section and the output level converting circuit only to the range where the proper operation is possible. Even when whatever voltage is input as the control voltage of the voltage-controlled oscillator, therefore, it is possible to stably output an accurate oscillation frequency over a wide range from a low-frequency area to a high-frequency area while a clock signal to be output has a stable duty and frequency.

Figure 8:
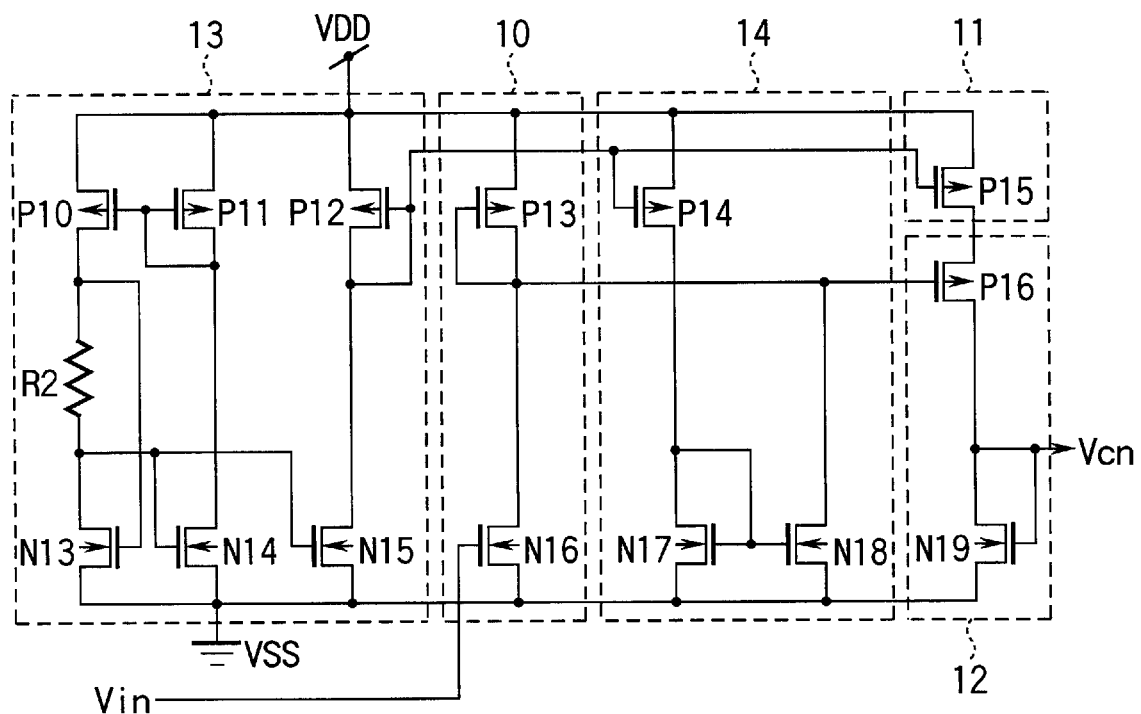
FIG. 8 is a circuit diagram exemplifying a specific structure of the level converting circuit shown in FIG. 7.

FIG. 8 is a circuit diagram exemplifying a specific structure of the level converting circuit shown in FIG. 7. The V/I converting section 10 comprises a PMOS transistor P13 and an NMOS transistor N16 and converts the input voltage Vin supplied to the gate of the MOS transistor N16 to a current proportional to this voltage. The constant current source 13 comprises PMOS transistors p10 to P12, NMOS transistors N13 to N15 and a resistor R2. The MOS transistors P10, P11, N13 and N14 and the resistor R2 generate a current I1, and the MOS transistors P12 and N15 adjusts the current level to generate a reference current Iref. The current value I1 of the constant current source 13 is given by $$I1 = (1/R2 \times s) \times \ln(N14 \times P10/(N13 \times P11))$$

where s is a slope factor representing the inclination of the Vg–logId characteristic of a soft inversion area, N14 is the W/L of the NMOS transistor N14, P10 is the W/L of the PMOS transistor P10, N13 is the W/L of the NMOS transistor N13 and P11 is the W/L of the PMOS transistor P11. The reference current Iref is given by $$Iref = I1 \times N15 \times P11/(N14 \times P10).$$

The Imax limiting section 11 is constituted by the PMOS transistor P15 and its limited current value Imax becomes $$Imax = Iref \times P15/P12$$

and can apparently be set by the size ratio of the PMOS transistors P12 and P15. Even when the input voltage Vin becomes the maximum value, therefore, the level converting circuit cannot output a current value which is larger than Imax.

The Imin limiting section 14 is constituted by the PMOS transistor P14 and NMOS transistors N17 and N18 and its limited current value Imin becomes $$Imin = Iref \times P14 \times N18/(P12 \times N17)$$

and can apparently be set by the size ratio of P12×N17 and P14×N18. Even when the input voltage Vin becomes the minimum value, therefore, the level converting circuit cannot output a current value which is smaller than Imin. While the control current value lies between Imax and Imin, the level converting circuit outputs the output current according to the conversion characteristic of the V/I converting section 10.

It is apparent from the above that whatever voltage is input as the input voltage Vin, the level converting circuit used in the voltage-controlled oscillator of this invention outputs the output current which limits the usable frequency range of the voltage-controlled oscillation section and the output level converting circuit only to the range where the proper operation is possible. It is therefore possible to guarantee the stable operation of the voltage-controlled oscillation section and the output level converting circuit.

The constant current source 13 which is used in the level converting circuit of this invention is not limited to the circuit structure illustrated in FIG. 8. Further, the constant current source that limits the value Imax and the value Imin need not be a common one, but separate constant current sources may be provided to set those two values separately.

SECOND EMBODIMENT

Figure 9:
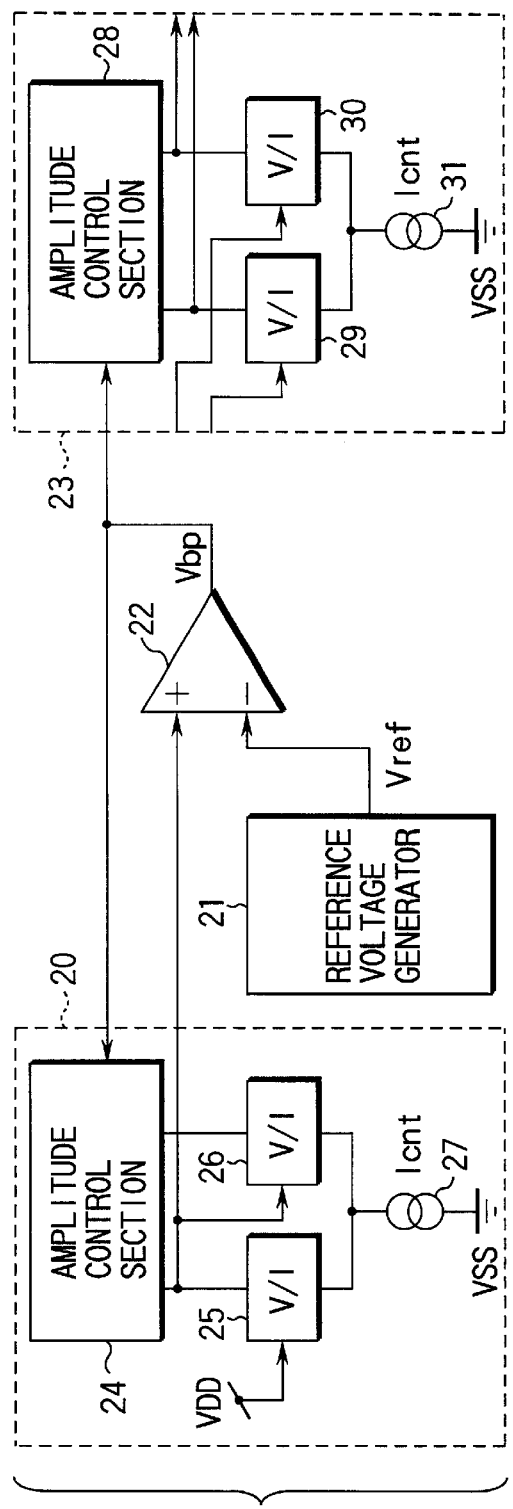
FIG. 9 is a conceptual diagram for explaining a voltage-controlled oscillator according to a second embodiment of this invention, exemplifying the structure of the delay cells that constitute an amplitude controller and a voltage-controlled oscillation section.

FIG. 9 is a conceptual diagram for explaining a voltage-controlled oscillator according to the second embodiment of this invention, and exemplifies the structure of the delay cells that constitute an amplitude controller and a voltage-controlled oscillation section, which are used in the voltage-controlled oscillator. The amplitude controller includes an amplitude-control target circuit 20, a reference voltage generator 21 and an operational amplifier 22. The amplitude-control target circuit 20 comprises an amplitude control section 24, a pair of V/I converting sections 25 and 26 and a constant current source 27. A power supply voltage VDD is supplied to the input terminal of the V/I converting section 25, and a control voltage which is supplied to the V/I converting section 25 from the amplitude control section 24 is supplied to the input terminal of the V/I converting section 26. That is, the control voltage is supplied to the V/I converting sections 25 and 26 from the amplitude control section 24. The constant current source 27 is connected between a power supply (ground) VSS and the V/I converting sections 25 and 26.

FIG. 9 shows a differential delay cell 23 as a typical one of the differential delay cells that constitute the voltage-controlled oscillation section to be controlled. A plurality of differential delay cells 23 are connected in a ring form to constitute a ring type voltage-controlled oscillation section, and each have substantially the same circuit structure as that of the amplitude-control target circuit 20. Specifically, each differential delay cell 23 comprises an amplitude control section 28, a pair of V/I converting sections 29 and 30 and a constant current source 31.

The reference voltage generator 21 generates a reference voltage Vref for amplitude control and outputs the voltage Vref. The control voltage from the amplitude control section 24, which is the output of the amplitude-control target circuit 20, and the reference voltage Vref generated by the reference voltage generator 21 are respectively supplied to the non-inverting input terminal (+) and inverting input terminal (−) of the operational amplifier 22, which outputs an amplitude control voltage Vbp for controlling the amplitude control section 28 in the voltage-controlled oscillation section. This operational amplifier 22 performs feedback control on the amplitude control section 24 in the amplitude-control target circuit 20 in such a manner that the received output of the amplitude-control target circuit 20 has the same voltage value as that of the reference voltage Vref generated by the reference voltage generator 21. Accordingly, the amplitude controller controls the amplitude of the oscillation waveform of the voltage-controlled oscillation section.

If gm (transconductance) for the amplitude control voltage Vbp of the amplitude control section 24 of the amplitude-control target circuit 20 is made equal to gm for the amplitude control voltage Vbp of the amplitude control section 28 of the delay cell 23, the operation becomes the same as that of the prior art, thus raising the problem of the prior art.

According to this invention, therefore, the problem of the prior art is overcome by making gm for the amplitude control voltage Vbp of the amplitude control section 24 of the amplitude-control target circuit 20 greater than gm for the amplitude control voltage Vbp of the amplitude control section 28 of the delay cell 23. Specifically, the transistor size of the amplitude control section 24 of the amplitude-control target circuit 20 is set larger than the transistor size of the amplitude control section 28 of the delay cell 23, so that the output of the amplitude-control target circuit 20 is so controlled as to be equal to the reference voltage Vref generated by the reference voltage generator 21 with respect to the same control voltage Vbp. Therefore, the output voltage on the delay cell side at that time becomes the power supply voltage VDD at the highest point and becomes (Vref−α) at the lowest point so that the output amplitude of the delay cell 23 becomes (VDD−Vref+α). This value α becomes small when the control voltage Vcn is low and the oscillation frequency of the voltage-controlled oscillation section is low, but becomes large when the control voltage Vcn is high and the oscillation frequency of the voltage-controlled oscillation section is high.

Therefore, the amplitude of the oscillation waveform of the voltage-controlled oscillation section depends on the control voltage Vcn that controls the oscillation frequency of the voltage-controlled oscillation section, so that as the control voltage Vcn becomes higher, making the oscillation frequency of the voltage-controlled oscillation section higher, the amplitude is controlled to be greater. Optimizing the value α can cancel out the operation of the conventional oscillator that makes the amplitude of the oscillation waveform of the voltage-controlled oscillation section smaller as the control voltage Vcn becomes higher, which makes the oscillation frequency of the voltage-controlled oscillation section higher. Accordingly, the amplitude controller of this invention can perform such control as to make the amplitude of the oscillation waveform of the voltage-controlled oscillation section approximately constant over a range from the low-frequency operation area to the high-frequency operation area of the voltage-controlled oscillation section.

Figure 10A:
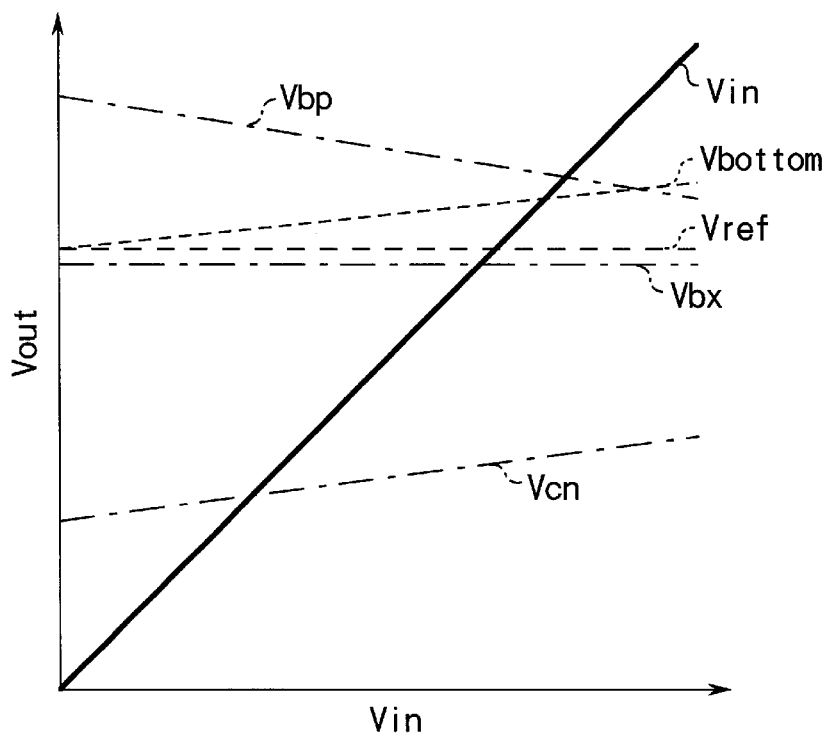
FIG. 10A is an operational characteristic diagram of a conventional amplitude controller for explaining the operational characteristic of the amplitude controller.
Figure 10B:
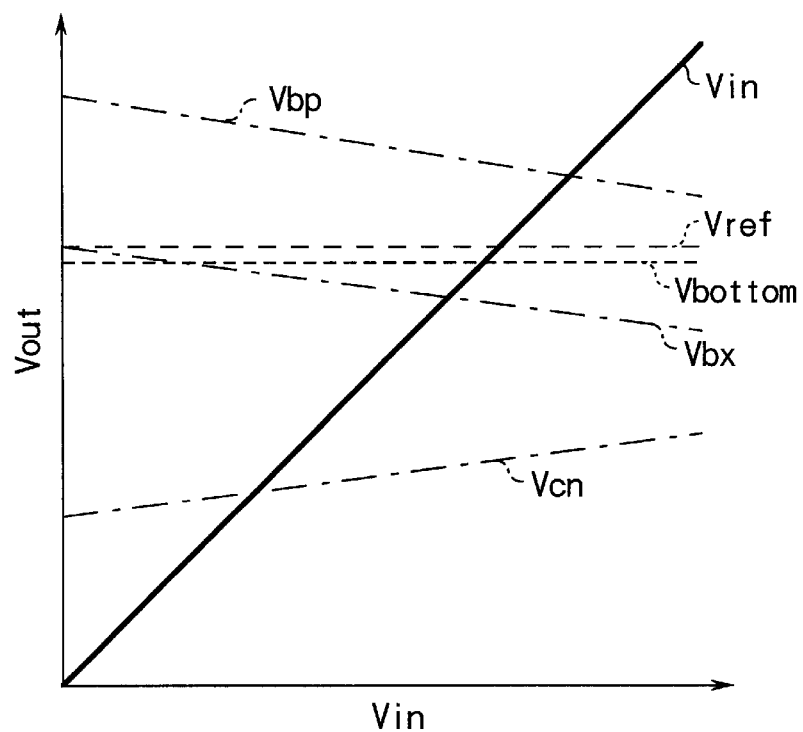
FIG. 10B is an operational characteristic diagram of the amplitude controller that is used in the voltage-controlled oscillator of this invention for explaining the operational characteristic of the amplitude controller.

FIG. 10A shows the operational characteristic of the conventional amplitude controller, and FIG. 10B shows the operational characteristic of the amplitude controller of this invention. FIGS. 10A and 10B both show changes in the control voltage Vcn for controlling the delay time of the delay cell, the amplitude control voltage Vbp for controlling the output amplitude of the delay cell, Vbottom that indicates the lower limit of the output amplitude when the delay cell constituting the voltage-controlled oscillation section is performing an oscillating operation (AC operation) and Vbx that indicates the lower limit of the output amplitude at the time of a still operation (DC operation) of the delay cell constituting the voltage-controlled oscillation section, with respect to the input voltage Vin of the voltage-controlled oscillator.

The reference voltage Vref generated by the reference voltage generator is constant because it does not depend on a change in input voltage Vin. The control voltage Vcn for controlling the delay time of the delay cell changes in such a way that as the input voltage Vin increases, it increases to thereby reduce the delay time of the delay cell. As the input voltage Vin increase, the current that flows through the delay cell increases. Therefore, the amplitude control voltage Vbp for controlling the output amplitude of the delay cell increases the gate-source voltage in such a way as to permit the flow of the current according to the increased current (as the source becomes the power supply voltage VDD, the control voltage Vbp decreases). This balancing of the control voltage Vcn and the control voltage Vbp controls the output amplitude of the delay cell.

In FIG. 10A which shows the operational characteristic of the conventional amplitude controller, the output voltage of the amplitude-control target circuit is so controlled as to be equal to the reference voltage Vref and Vbx which indicates the lower limit of the output amplitude in the still operation of the delay cell is also so controlled as to be equal to the reference voltage Vref. As the input voltage Vin increases, increasing the oscillation frequency, however, Vbottom which indicates the lower limit of the output amplitude in the oscillating operation of the delay cell rises, thus making the oscillation amplitude of the voltage-controlled oscillation section smaller.

In FIG. 10B which shows the operational characteristic of the amplitude controller of this invention, while the output voltage of the amplitude-control target circuit is so controlled as to be equal to the reference voltage Vref, Vbx indicating the lower limit of the output amplitude in the still operation of the delay cell is not controlled to be equal to the reference voltage Vref. As the input voltage Vin increases, increasing the oscillation frequency, therefore, Vbx decreases (the output amplitude increases). This characteristic cancels out the characteristic in FIG. 10A in which Vbottom indicating the lower limit of the output amplitude in the oscillating operation of the delay cell rises as the oscillation frequency of the voltage-controlled oscillation section increases. As a result, the lower limit Vbottom of the output amplitude becomes constant.

Figure 11:
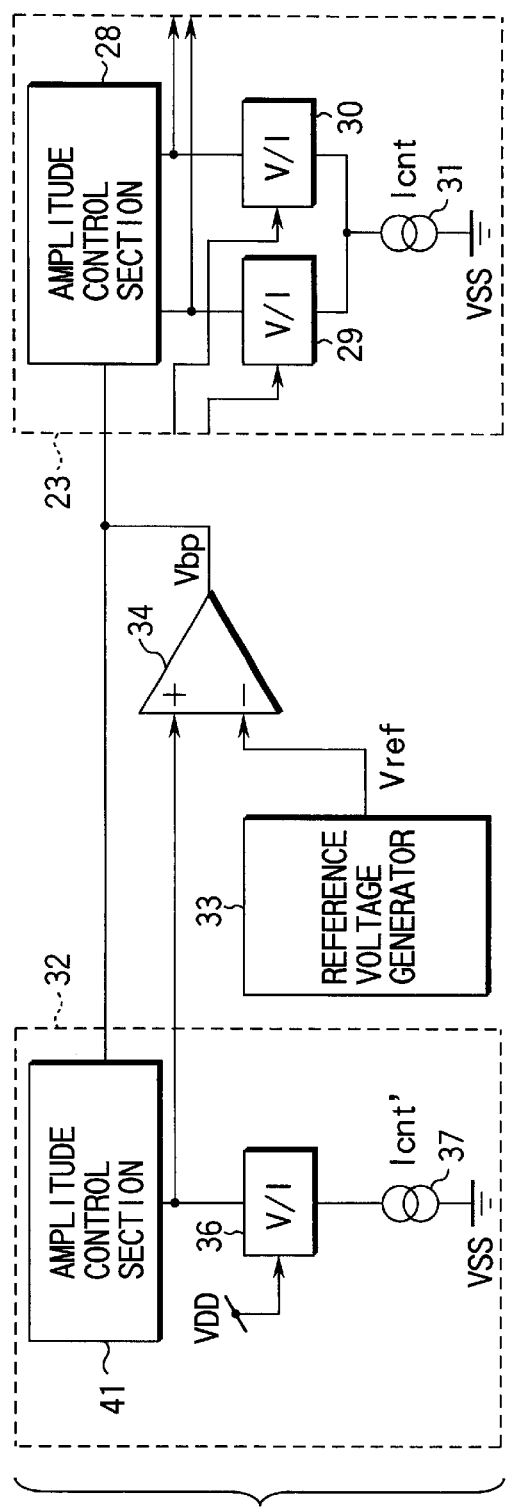
FIG. 11 is a conceptual diagram for explaining the voltage-controlled oscillator according to the second embodiment of this invention, showing another structure of the delay cells that constitute the amplitude controller and voltage-controlled oscillation section.

FIG. 11 is a conceptual diagram for explaining the voltage-controlled oscillator according to the second embodiment of this invention, and exemplifies another structure of the delay cells that constitute the amplitude controller and voltage-controlled oscillation section. An amplitude-control target circuit 32 shown in FIG. 11 has a circuit structure which is a half of the circuit structure of the differential delay cell 23 that constitutes the voltage-controlled oscillation section to be controlled. Specifically, the amplitude-control target circuit 32 has a single amplitude control section 41 connected in series to a V/I converting section 36 whose input terminal is connected to the power supply voltage VDD, and the output current of the V/I converting section 36 is connected to a current control section 37 whose current value is smaller than that of a current control section 31 of the differential delay cell 23 that constitutes the voltage-controlled oscillation section to be controlled.

If gm of the amplitude control section 41 of the amplitude-control target circuit 32 is set equal to gm of the amplitude control section 28 of the delay cell 23 and the current value Icont' of the current control section 37 of the amplitude-control target circuit 32 is set to half the current value Icont of the current control section 31 of the delay cell 23, the value of the current which flows through the V/I converting section 36 in the amplitude-control target circuit 32 becomes smaller than that of the current in the delay cell 23. As a result, the output voltage becomes higher than that of the amplitude-control target circuit shown in FIG. 9 and the output voltage on the delay cell side becomes lower. Note that the value α of the output amplitude (VDD−Vref+α) of the delay cell 23 in this mode may become too large.

In this example, the value α can be set to the optimal value by making gm of the amplitude control section 41 of the amplitude-control target circuit 32 smaller than gm of the amplitude control section 28 of the delay cell 23, or making the current value Icont' of the current control section 37 of the amplitude-control target circuit 32 larger than a half of the current value Icont of the current control section 31 of the delay cell 23, or a combination of both. When the value α becomes too large, it raises such a problem that the fmax characteristic is degraded in the high-frequency operation area, though it does not raise the critical problem to the voltage-controlled oscillator such that the voltage-controlled oscillator cannot output a clock signal. As apparent from the above, this invention can overcome the problems of the prior art and can still simplify the circuit scale.

As the prior art requires that the differential delay cells constituting the voltage-controlled oscillation section have the same circuit structure as the amplitude-control target circuit, parasitic elements or the like which are originated from the mask layout patterns should also be made identical. That is, the prior art suffers restrictions on the mask layout patterns, such as the circuit layout or the like being so designed as to set the mask layout patterns identical to one another. According to this invention, however, the delay cells constituting the voltage-controlled oscillation section differ from the amplitude-control target circuit in the transistor size, so that no equality is required. This invention therefore has no restrictions on the mask layout patterns and simplifies the design of the mask layout. This indicates that this invention is less affected by a process-originated variation in the shapes of transistors than the prior art.

Figure 12:
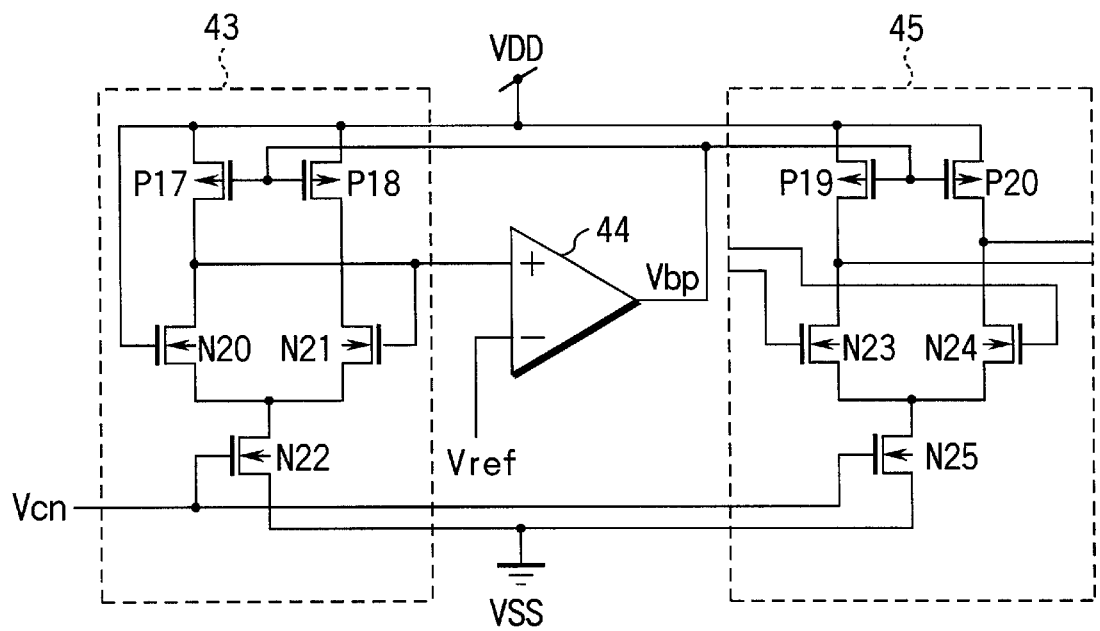
FIG. 12 is a circuit diagram exemplifying a specific structure of the delay cells that constitute the amplitude controller and voltage-controlled oscillation section shown in FIG. 9.
Figure 13:
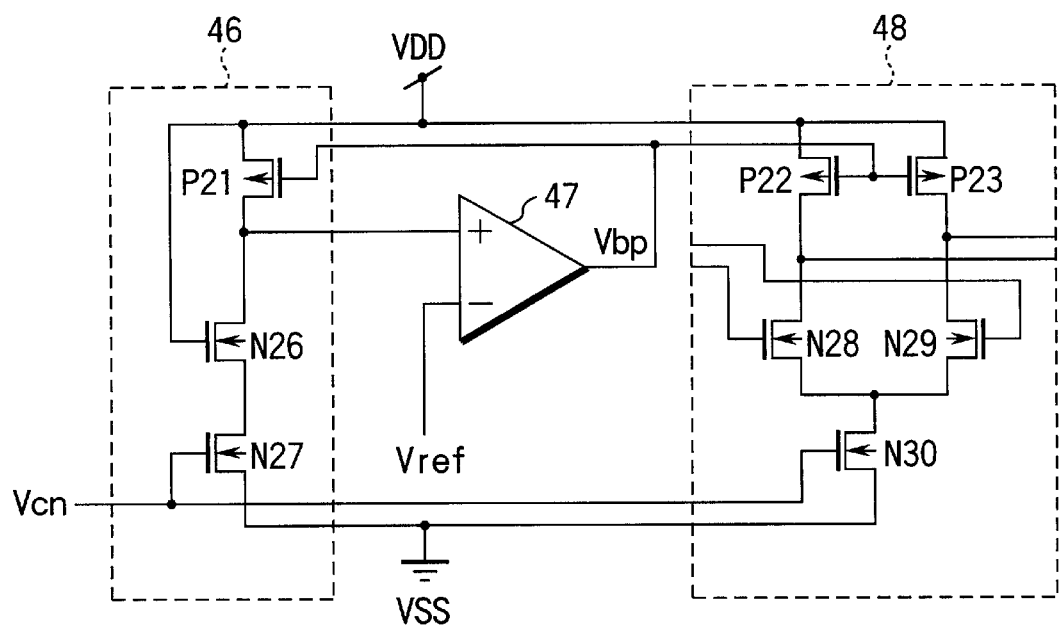
FIG. 13 is a circuit diagram exemplifying a specific structure of the delay cells that constitute the amplitude controller and voltage-controlled oscillation section shown in FIG. 11.

FIGS. 12 and 13 are circuit diagrams which respectively exemplify a specific structure of the delay cells that constitute the amplitude controller and voltage-controlled oscillation section shown in FIG. 9 and a specific structure of the delay cells that constitute the amplitude controller and voltage-controlled oscillation section shown in FIG. 11. The amplitude controller and delay cell shown in FIG. 12 are an example of the structure of the circuit shown in FIG. 9. A differential delay cell 45 has an amplitude control section comprising PMOS transistors P19 and P20, a V/I converting section comprising NMOS transistors N23 and N24 to which differential output signals are input, and a current control section comprising an NMOS transistor N25 to whose gate an oscillation frequency control voltage Vcn is input. A plurality of delay cells 45 are connected in a ring form to constitute the voltage-controlled oscillation section.

An amplitude-control target circuit 43, which has the same circuit structure as the differential delay cell 45, has an amplitude control section comprising PMOS transistors P17 and P18, a V/I converting section comprising input NMOS transistors N20 and N21, and a current control section comprising an NMOS transistor N22 to which the oscillation frequency control voltage Vcn is input.

By setting the transistor sizes of the PMOS transistors P17 and P18 of the amplitude control section of the amplitude-control target circuit 43 larger than those of the PMOS transistors P19 and P20 of the amplitude control section of the delay cell 45, the output of the amplitude-control target circuit 43 is so controlled as to be equal to the reference voltage Vref generated by the reference voltage generator and the output voltage of the delay cell 45 is so controlled as to be a voltage (Vref−α) lower than the reference voltage Vref, with respect to the same amplitude control voltage Vbp. This value α becomes smaller when the control voltage Vcn is low and the oscillation frequency of the voltage-controlled oscillation section is low but becomes greater when the control voltage Vcn is high and the oscillation frequency of the voltage-controlled oscillation section is high.

Therefore, the amplitude controller used in the voltage-controlled oscillator of this invention depends on the control voltage Vcn for controlling the oscillation frequency of the voltage-controlled oscillation section and performs such control as to increase the output amplitude of the voltage-controlled oscillation section as the control voltage Vcn increases, thus increasing the oscillation frequency of the voltage-controlled oscillation section. This characteristic cancels out the characteristic in which the output amplitude of the delay cell 45 becomes smaller as the oscillation frequency of the voltage-controlled oscillation section increases. It is therefore possible to control the output amplitude of the voltage-controlled oscillation section in such a way that the output amplitude becomes approximately constant over a range from the low-frequency operation area to the high-frequency operation area.

The amplitude controller shown in FIG. 13 is an example of the structure of the circuit shown in FIG. 11. An amplitude-control target circuit 46 has a circuit structure which is half the circuit structure of a differential delay cell 48 that constitutes the voltage-controlled oscillation section. Specifically, the differential delay cell 48 has an amplitude control section comprising PMOS transistors P22 and P23, a V/I converting section comprising NMOS transistors N28 and N29 to which differential output signals are input, and a current control section comprising an NMOS transistor N30 to whose gate an oscillation frequency control voltage Vcn is input, whereas the amplitude-control target circuit 46 has an amplitude control section comprising a PMOS transistor P21, a V/I converting section comprising an NMOS transistor N26 to whose gate the supply voltage VDD is applied, and a current control section comprising an NMOS transistor N27 to whose gate the control voltage Vcn is applied.

The amplitude control section, the V/I converting section and the current control section are connected in series between the power supplies VDD and VSS. The transistor size of the NMOS transistor N27 is made small so that the value of the output current of the current control section becomes smaller than the output current of the current control section of the differential delay cell 48 that constitutes the voltage-controlled oscillation section to be controlled. In this example, the value α can be set to the optimal value by making the transistor size of the PMOS transistor P21 of the amplitude control section of the amplitude-control target circuit 46 smaller than the transistor size of the PMOS transistor P22 (or the PMOS transistor P23) of the amplitude control section of the delay cell 45 or making the transistor size of the NMOS transistor N27 of the current control section of the amplitude-control target circuit 46 smaller than half the transistor size of the NMOS transistor N30 of the current control section of the delay cell 48. As a result, the amplitude controller used in the voltage-controlled oscillator of this invention can control the output amplitude of the voltage-controlled oscillation section in such a way that the output amplitude becomes approximately constant over a range from the low-frequency operation area to the high-frequency operation area.

In the case of the amplitude controller shown in FIG. 12, a small loop is formed by the NMOS transistors N20 and N21 in addition to the feedback loop of the amplitude control voltage Vbp, so that this amplitude controller is likely to be unstable. Thus, the operation of the circuit shown in FIG. 13 is more stable than that of the amplitude controller alone. It is to be noted however that the at the time of using the amplitude controller in FIG. 12, the circuit has only to be designed in a sufficient consideration of the circuit design and parasitic elements or the like on the mask layout.

Figure 14:
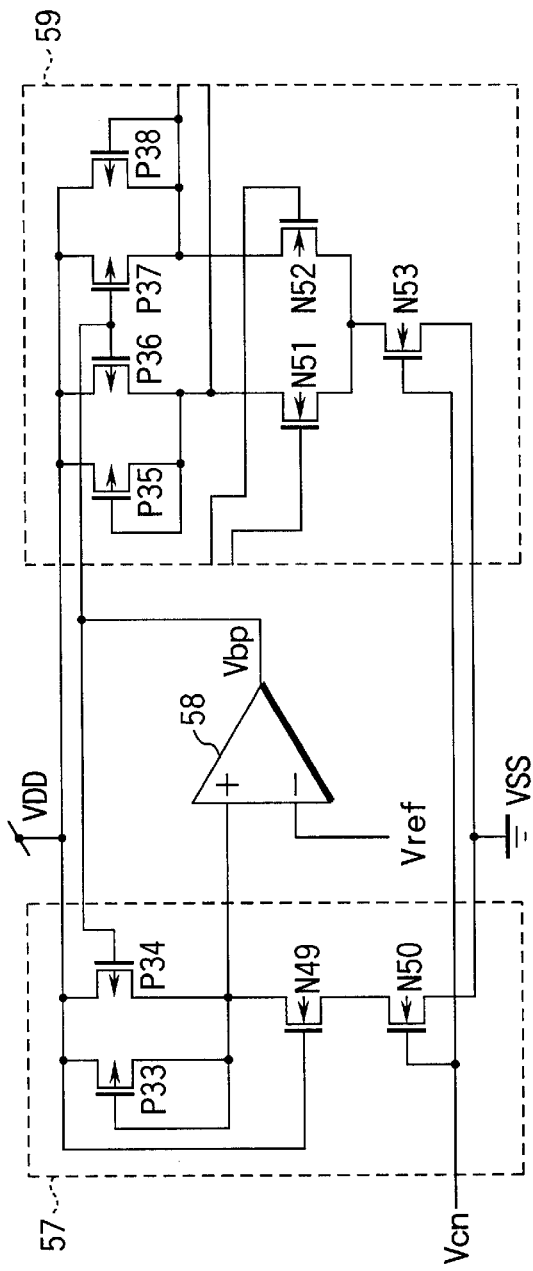
FIG. 14 is a circuit diagram exemplifying another specific structure of the delay cells that constitute the amplitude controller and voltage-controlled oscillation section.

FIG. 14 is a circuit diagram exemplifying another specific structure of the delay cells that constitute the amplitude controller and voltage-controlled oscillation section. A differential delay cell 59 has an amplitude control section comprising PMOS transistors P36 and P37, a V/I converting section comprising NMOS transistors N51 and N52 to which differential output signals are input, a current control section comprising an NMOS transistor N53 to whose gate the oscillation frequency control voltage Vcn is input, and load PMOS transistors P35 and P38 inserted in parallel to the PMOS transistors P36 and P37. Each load PMOS transistor P35 or P38 has its gate and drain connected together.

An amplitude-control target circuit 57 has an amplitude control section comprising a PMOS transistor P34, a load PMOS transistor P33 which has its gate and drain connected together and which is inserted in parallel to the PMOS transistor P34, a V/I converting section comprising an NMOS transistor N49 to whose gate the power supply voltage VDD is applied, and a current control section comprising an NMOS transistor N50 whose current driving capability is smaller than that of the current control section of the differential delay cell 59.

In this example, the value α can be set to the optimal value by making the transistor size of the PMOS transistor P34 of the amplitude control section of the amplitude-control target circuit 57 smaller than the transistor size of the PMOS transistor P36 (or the PMOS transistor P37) of the amplitude control section of the delay cell 59 or making the transistor size of the NMOS transistor N50 of the current control section of the amplitude-control target circuit 57 smaller than half the transistor size of the NMOS transistor N53 of the current control section of the delay cell 59. The load PMOS transistors P33, P35 and P38 each having its gate and drain connected together have such a characteristic as to be able to keep the lower limit of the output amplitude of the delay cell 59 stable and enhance the linearity of the relationship between the amplitude control current and the output amplitude of the amplitude control section of the delay cell 59.

The stabilization of the lower limit of the output amplitude of the delay cell 59 can prevent the voltage-controlled oscillation section from going into an abnormal operation state and help the locking of the PLL at the power-ON time or when the voltage-controlled oscillation section is unstable due to an interference such as noise. Further, the linearity of the relationship between the amplitude control current and the output amplitude of the amplitude control section of the delay cell 59 has an effect of enhancing the stability of the feedback control to carry out amplitude control and has an effect of improving the stability of the oscillation amplitude and the linearity of the oscillation characteristic of the voltage-controlled oscillation section.

Figure 15:
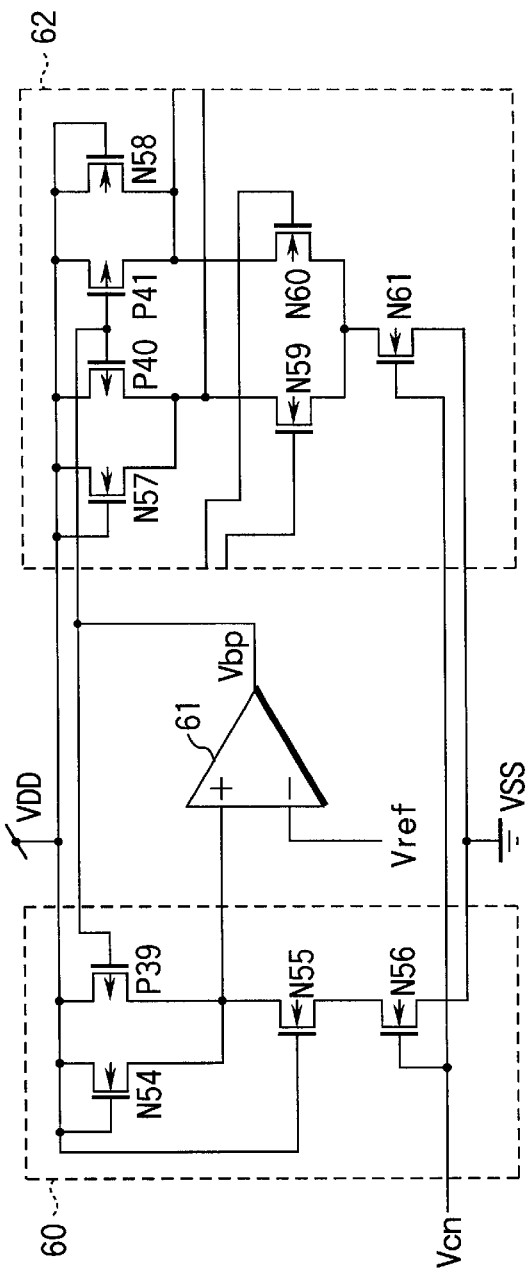
FIG. 15 is a circuit diagram exemplifying a further specific structure of the delay cells that constitute the amplitude controller and voltage-controlled oscillation section.

FIG. 15 is a circuit diagram exemplifying a further specific structure of the delay cells that constitute the amplitude controller and voltage-controlled oscillation section. A delay cell 62 has an amplitude control section comprising PMOS transistors P40 and P41, a V/I converting section comprising NMOS transistors N59 and N60 to which differential output signals are input and which are respectively connected in parallel to the PMOS transistors P40 and P41, a current control section comprising an NMOS transistor N61 to whose gate the oscillation frequency control voltage Vcn is input, and load NMOS transistors N57 and N58 each having a gate and drain applied with the power supply voltage VDD.

An amplitude-control target circuit 60 has a circuit structure which is half the circuit structure of a differential delay cell 62. Specifically, the differential delay cell 60 has an amplitude control section comprising a PMOS transistor P39, a load NMOS transistor N54 whose gate and drain are applied with the power supply voltage VDD, a V/I converting section comprising an NMOS transistor N54 to whose gate the power supply voltage VDD is applied, and a current control section comprising an NMOS transistor N56 whose current driving capability is smaller than the current driving capability of the current control section of the differential delay cell 62.

In this example, the value α can be set to the optimal value by making the transistor size of the PMOS transistor P39 of the amplitude control section of the amplitude-control target circuit 60 smaller than the transistor size of the PMOS transistor P40 (or the PMOS transistor P41) of the amplitude control section of the delay cell 62 or making the transistor size of the NMOS transistor N56 of the current control section of the amplitude-control target circuit 60 smaller than half the transistor size of the NMOS transistor N61 of the current control section of the delay cell 62. The load NMOS transistors N54, N57 and N58 each having its gate and drain applied with the power supply voltage VDD have such a characteristic as to be able to keep the lower limit of the output amplitude of the delay cell 62 stable and enhance the linearity of the relationship between the amplitude control current and the output amplitude of the amplitude control section of the delay cell 62.

The stabilization of the lower limit of the output amplitude of the delay cell 62 can prevent the voltage-controlled oscillation section from going into an abnormal operation state and help the locking of the PLL at the power-ON time or when the voltage-controlled oscillation section is unstable due to an interference such as noise. Further, the linearity of the relationship between the amplitude control current and the output amplitude of the amplitude control section of the delay cell 62 has an effect of enhancing the stability of the feedback control to carry out amplitude control and has an effect of improving the stability of the oscillation amplitude and the linearity of the oscillation characteristic of the voltage-controlled oscillation section.

THIRD EMBODIMENT

Figure 16:
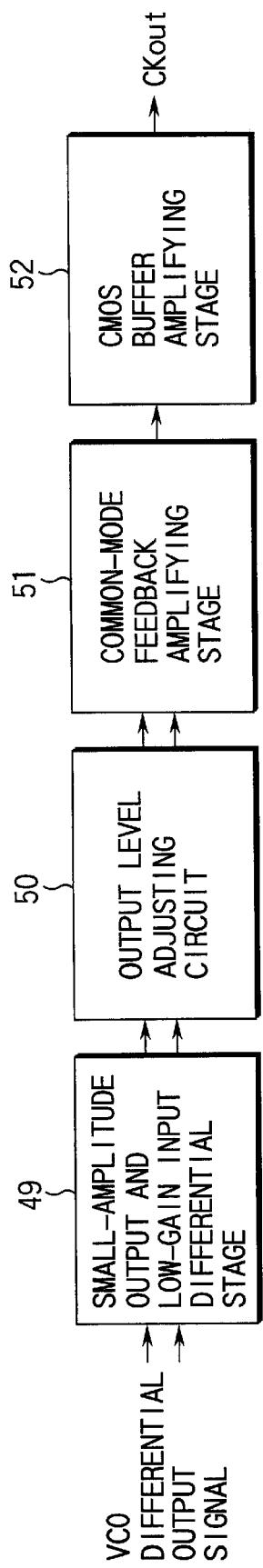
FIG. 16 is a conceptual diagram of an output level converting circuit for explaining a voltage-controlled oscillator according to a third embodiment of this invention.

FIG. 16 is a conceptual diagram of an output level converting circuit for explaining a voltage-controlled oscillator according to a third embodiment of this invention. An output level converting circuit according to this invention comprises a small-amplitude output and low-gain input differential stage 49, an output level adjusting circuit 50, a common-mode feedback amplifying stage 51 and a CMOS buffer amplifying stage 52.

A small-amplitude differential oscillation signal from the voltage-controlled oscillation section that comprises differential delay cells is input to the small-amplitude output and low-gain input differential stage 49 and is amplified by a low gain (several times). As the output amplitude is restricted in terms of the circuit, however, the gain of the small-amplitude output and low-gain input differential stage 49 contributes to improving the through rate of the output waveform (the amount of a change in the voltage of the output waveform per unit time) and helps enhancing the speed of the subsequent amplifying stage (shortening the delay time). The differential output signal of the small-amplitude output and low-gain input differential stage 49 is input to the output level adjusting circuit 50 at the next stage.

The output level adjusting circuit 50 constitutes a reference circuit whose circuit structure is half the circuit structure of the small-amplitude output and low-gain input differential stage 49. This reference circuit performs such control as to prevent the output level from changing with respect to an environmental change, such as a variation in process or the supply voltage. The output signal of the output level adjusting circuit 50 is input to the common-mode feedback amplifying stage 51. The common-mode feedback amplifying stage 51 converts the level of the small-amplitude output signal of the output level adjusting circuit 50 to the CMOS level.

A common-mode feedback control circuit which adjusts the operation level by referring to the level of the output signal of the common-mode feedback amplifying stage 51 can keep the operation level of the common-mode feedback amplifying stage 51 itself stable, keep the duty of the clock signal to be output stable and stably convert the output level of the clock signal to be output to the CMOS level, with respect to an environmental change, such as a variation in process or the supply voltage. The output signal of the common-mode feedback amplifying stage 51 is input to the normal CMOS buffer amplifying stage 52.

The CMOS buffer amplifying stage 52 is set in such a manner that the output drive current accords to the output frequency and the output load (the number of output fan-outs), and shapes the waveform of the output signal of the common-mode feedback amplifying stage 51 and outputs the shaped signal.

Figure 17:
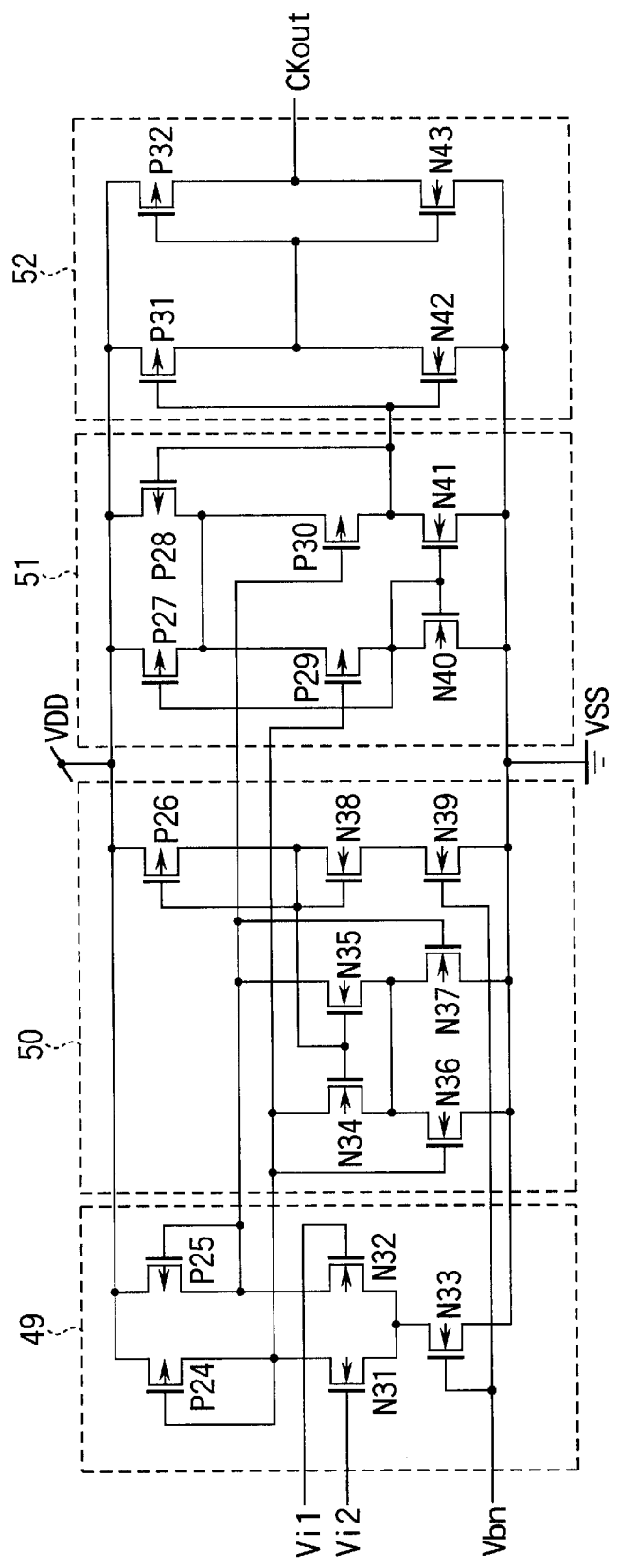
FIG. 17 is a circuit diagram exemplifying a specific structure of the output level converting circuit shown in FIG. 16.

FIG. 17 is a circuit diagram exemplifying a specific structure of the output level converting circuit shown in FIG. 16. The small-amplitude output and low-gain input differential stage 49 comprises PMOS transistors P24 and P25 each having its drain and gate connected together, NMOS transistors N31 and N32 to whose gates input signals Vi1 and Vi2 are respectively input, and an NMOS transistor N33 which is connected to the common source of those NMOS transistors N31 and N32 and controls the bias current.

The output level adjusting circuit 50 constitutes a reference circuit whose circuit structure is half the circuit structure of the small-amplitude output and low-gain input differential stage 49 by using a PMOS transistor P26 and NMOS transistors N38 and N39. This reference circuit performs such control as to input the output voltage of the reference circuit to the gates of NMOS transistors N34 and N35 connected to the output of the small-amplitude output and low-gain input differential stage 49 so that the output level of the small-amplitude output and low-gain input differential stage 49 does not change with respect to an environmental change, such as a variation in process or the supply voltage. NMOS transistors N36 and N37 carry out feedback control so that the output level of the small-amplitude output and low-gain input differential stage 49 does not change with respect to a variation in the common-mode level of the input signals Vi1 and Vi2 input to the MOS transistors N31 and N32.

The output signal of the small-amplitude output and low-gain input differential stage 49 whose level has been adjusted by the output level adjusting circuit 50 is input to the common-mode feedback amplifying stage 51, which amplifies the small-amplitude input signal and outputs an output signal of the CMOS level. This output level adjusting circuit 50 has NMOS transistors N40 and N41 as load circuits which are respectively connected to the drains of input PMOS transistors P29 and P30, thereby constituting a differential amplifier. PMOS transistors P27 and P28 carry out feedback control so that the output level does not vary with respect to a variation in the common-mode level of the input signals input to the MOS transistors P29 and P30.

The CMOS buffer amplifying stage 52 has a CMOS inverter circuit comprising a PMOS transistor P31 and an NMOS transistor N42, and a normal CMOS inverter circuit comprising a PMOS transistor P32 and an NMOS transistor N43. The transistor sizes of the PMOS transistor P32 and the NMOS transistor N43 are set in such a manner that the output drive current accords to the output frequency and the output load (the number of output fan-outs). The small-amplitude output and low-gain input differential stage 49 at the first stage has a low gain, so that when the input amplitude is low, plural stages are connected in series to increase the total gain.

Figure 18:
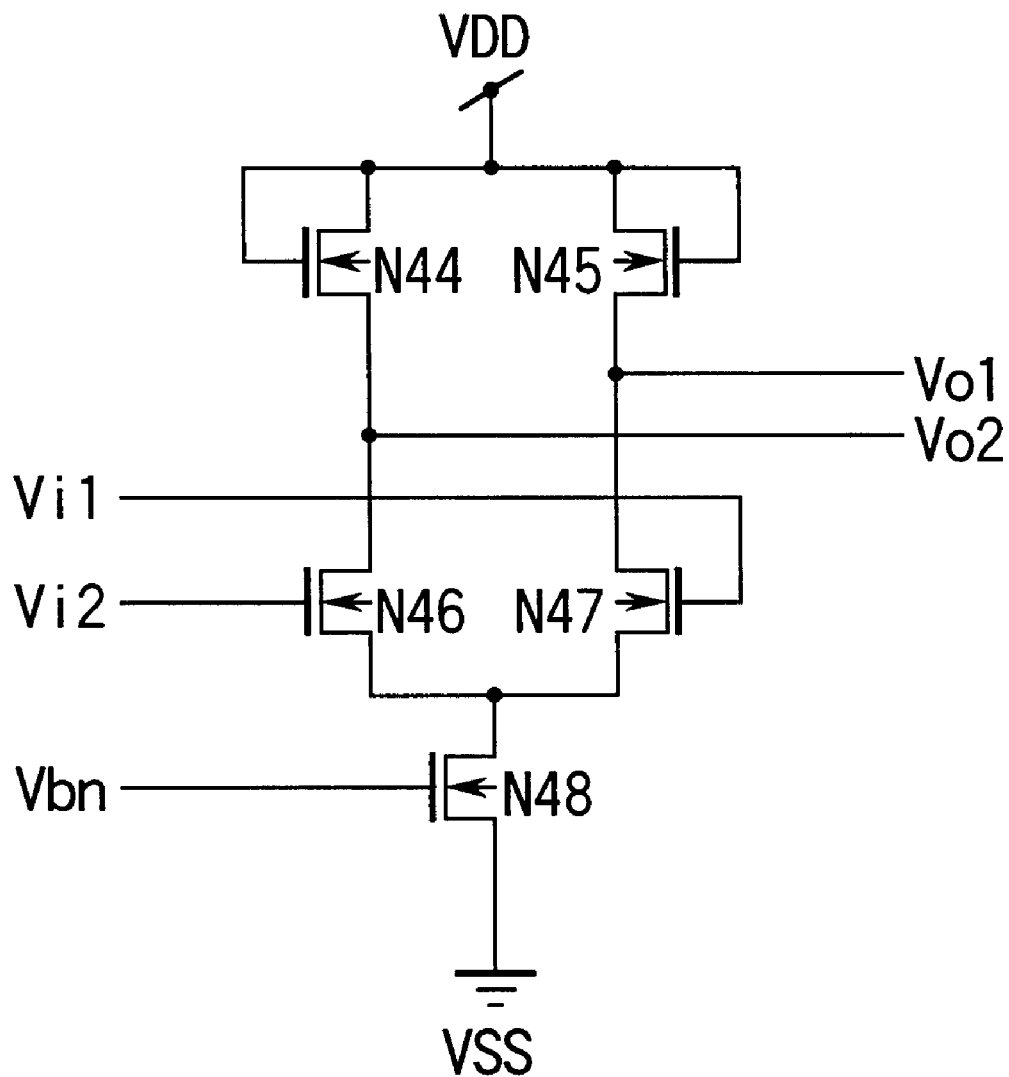
FIG. 18 is a circuit diagram exemplifying another structure of a small-amplitude output and low-gain input differential stage that constitutes the output level converting circuit shown in FIG. 16.

FIG. 18 is a circuit diagram exemplifying another structure of the small-amplitude output and low-gain input differential stage 49. This circuit comprises NMOS transistors N44 and N45 each having its drain and gate connected to the power supply voltage VDD, NMOS transistors N46 and N47 to whose gates the input signals Vi1 and Vi2 are respectively input, and an NMOS transistor N48 which is connected to the common source of those NMOS transistors N46 and N47 and controls the bias current. The reference circuit which is used in the output level adjusting circuit 50 has a circuit structure that is half the circuit structure of the small-amplitude output and low-gain input differential stage 49, and carries out such control that the output level does not vary with respect to an environmental change, such as a variation in process or the supply voltage.

The level converting circuit, the amplitude controller and the output level converting circuit in each of the above-described embodiments of this invention can be constructed by using their circuit techniques individually or by selectively combining the circuit techniques.

The above-described circuit structures of this invention are so designed as to operate based on the power supply voltage VDD. If the polarities of the MOS transistors are changed from one to the other so that each circuit structure has N channel MOS transistors replaced with P channel MOS transistors, the circuit structure operates based on the ground voltage VSS while providing the same advantages.

As described above, the level converting circuit used in the voltage-controlled oscillator that embodies this invention includes limiters for limiting the maximum value Imax and minimum value Imin of the control current. Those limiters can make usable only the region where the voltage-controlled oscillation section properly performs its oscillating operation, making it possible to improve the stability of the duty and frequency of the clock signal that is output from the voltage-controlled oscillator.

The amplitude controller used in the voltage-controlled oscillator of this invention controls the oscillation amplitude of the voltage-controlled oscillation section to become the reference voltage Vref in the low-frequency operation area and to become (VDD−Vref+α) in the high-frequency operation area. This prevents the oscillation amplitude of the voltage-controlled oscillation section from becoming smaller in a high-frequency operation area, and can make the oscillation amplitude approximately constant from the low-frequency operation area to the high-frequency operation area, thus eliminating the dependency of the oscillation amplitude on the operational frequency.

Further, even if the output amplitude of the voltage-controlled oscillation section or the center voltage of the output amplitude varies, the output level converting circuit used in the voltage-controlled oscillator of this invention can operate stably without making the amplitude and duty of the output waveform of the output level converting circuit affected by those variations.

By selectively using the level converting circuit, the amplitude controller and the output level converting circuit, therefore, it is possible to control the output amplitude of the voltage-controlled oscillation section to be approximately constant even if the oscillation frequency of the voltage-controlled oscillation section becomes higher. This voltage-controlled oscillator provided by this invention can output a clock signal with a stable and accurate oscillation frequency over a wide range from the low-frequency area to the high-frequency area.

Further, it is possible to widen the variable range of the oscillation frequency of the voltage-controlled oscillator and make the voltage-controlled oscillator adaptable to various application systems.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A voltage-controlled oscillator comprising a level converting circuit which includes:
   a V/I converting section for converting an input control voltage to a control current for controlling a voltage-controlled oscillation section;
   a first limiter for limiting a maximum value of said control current with respect to said converted current;
   a second limiter for limiting a minimum value of said control current; and
   a constant current source for generating a reference current for said first and second limiters.

2. The voltage-controlled oscillator according to claim 1, wherein said maximum value of said control current which is limited by said first limiter is a control current value not greater than either a maximum oscillation frequency of said voltage-controlled oscillation section or a maximum oscillation frequency of an output level converting circuit, whichever is smaller.

3. The voltage-controlled oscillator according to claim 1, wherein said minimum value of said control current which is limited by said second limiter is a control current value not smaller than either a minimum oscillation frequency of said voltage-controlled oscillation section or a minimum oscillation frequency of an output level converting circuit, whichever is greater.

4. The voltage-controlled oscillator according to claim 1, wherein said V/I converting section includes a first transistor of a first conductivity type whose current path has one end connected to a first potential source, and a second transistor of a second conductivity type whose current path has one end connected to an other end of said current path of said first transistor and a gate thereof and an other end connected to a second potential source and whose gate is supplied with said control voltage.

5. The voltage-controlled oscillator according to claim 4, wherein said constant current source includes a third transistor of said first conductivity type whose current path has one end connected to said first potential source, a fourth transistor of said first conductivity type whose current path has one end connected to said first potential source and whose gate is connected to a gate of said third transistor, a load element having one end connected to an other end of said current path of said third transistor, a fifth transistor of said second conductivity type whose current path has one end connected to an other end of said load element and an other end connected to said second potential source and whose gate is connected to said other end of said current path of said third transistor, a sixth transistor of said second conductivity type whose current path has one end connected to an other end of said current path of said fourth transistor and said gate thereof and an other end connected to said second potential source and whose gate is connected to said other end of said load element, a seventh transistor of said first conductivity type whose current path has one end connected to said first potential source, and an eighth transistor of said second conductivity type whose current path has one end connected to an other end of said current path of said seventh transistor and a gate thereof and an other end connected to said second potential source and whose gate is connected to said other end of said load element.

6. The voltage-controlled oscillator according to claim 5, wherein said first limiter includes a ninth transistor of said first conductivity type whose current path has one end connected to said first potential source and whose gate is connected to said other end of said current path of said seventh transistor.

7. The voltage-controlled oscillator according to claim 6, wherein said second limiter includes a tenth transistor of said first conductivity type whose current path has one end connected to said first potential source and whose gate is connected to said other end of said current path of said seventh transistor, an eleventh transistor of said second conductivity type whose current path has one end connected to an other end of said current path of said tenth transistor and an other end connected to said second potential source and whose gate is also connected to said other end of said current path of said tenth transistor, and a twelfth transistor of said second conductivity type whose current path has one end connected to said other end of said current path of said first transistor and an other end connected to said second potential source and whose gate is connected to said gate of said eleventh transistor.

8. The voltage-controlled oscillator according to claim 7, further comprising an I/V converting section for outputting a control voltage for controlling an oscillation frequency of said voltage-controlled oscillator, said I/V converting section including a thirteenth transistor of said first conductivity type whose current path has one end connected to an other end of said current path of said ninth transistor and whose gate is connected to said other end of said current path of said first transistor, and a fourteenth transistor of said second conductivity type whose current path has one end connected to an other end of said current path of said thirteenth transistor and an other end connected to said second potential source and whose gate is also connected to said other end of said current path of said thirteenth transistor, whereby said control voltage is output from a node between said current paths of said thirteenth transistor and said fourteenth transistor.

9. A voltage-controlled oscillator having a voltage-controlled oscillation section and an amplitude controller for controlling an amplitude of a signal output from said voltage-controlled oscillation section, said voltage-controlled oscillation section having a plurality of differential delay cells connected in a ring form, each of said differential delay cells including first amplitude control means, first V/I converting means having an input terminal to which a differential signal is input, and first current control means to which an output current of said first V/I converting means is commonly supplied, said amplitude controller including,
an amplitude-control target circuit having second amplitude control means, second V/I converting means whose input terminal is applied with a supply voltage and which is controlled by an output of said second amplitude control means, and second current control means to which an output current of said second V/I converting means is supplied, a reference voltage generator for generating and outputting a reference voltage for amplitude control, and an operational amplifier for receiving said reference voltage output from said reference voltage generator and an output voltage of said amplitude-control target circuit and outputting a control voltage for controlling said first amplitude control means in said differential delay cells and said second amplitude control means in said amplitude-control target circuit in such a way that a potential difference between said reference voltage and said output voltage becomes zero, wherein a difference between a lower limit of an oscillation amplitude of said differential delay cells which are performing an AC operation and said output voltage of said amplitude-control target circuit which is performing a DC operation is corrected by said control voltage output from said operational amplifier.

10. A voltage-controlled oscillator comprising a voltage-controlled oscillation section and an amplitude controller for controlling an amplitude of a signal output from said voltage-controlled oscillation section, said voltage-controlled oscillation section having a plurality of differential delay cells connected in a ring form, each of said differential delay cells including a first amplitude control section, first and second V/I converting sections having input terminals to which differential signals are input, and a first current control section to which output currents of said first and second V/I converting sections are commonly supplied, said amplitude controller including,
an amplitude-control target circuit having a second amplitude control section, a third V/I converting section whose input terminal is applied with a supply voltage and which is controlled by an output of said second amplitude control section, a fourth V/I converting section whose input terminal is supplied with an output voltage of said third V/I converting section and which is controlled by said output of said second amplitude control section, and a second current control section to which output currents of said third and fourth V/I converting sections are commonly supplied and whose current value is equal to that of said first current control section, a reference voltage generator for generating and outputting a reference voltage for amplitude control, and an operational amplifier for receiving said reference voltage output from said reference voltage generator and an output voltage of said amplitude-control target circuit and outputting an amplitude control voltage for controlling said first amplitude control sections in said differential delay cells and said second amplitude control section in said amplitude-control target circuit in such a way that a potential difference between said reference voltage and said output voltage becomes zero, wherein a transconductance of said second amplitude control section of said amplitude-control target circuit is greater than a transconductance of said first amplitude control sections of said differential delay cells constituting said voltage-controlled oscillation section with respect to the same control voltage output from said operational amplifier.

11. The voltage-controlled oscillator according to claim 10, wherein said amplitude-control target circuit includes a first transistor of a first conductivity type whose current path has one end connected to a first potential source and whose gate is applied with said amplitude control voltage, a second transistor of said first conductivity type whose current path has one end connected to said first potential source and whose gate is applied with said amplitude control voltage, a third transistor of a second conductivity type whose current path has one end connected to an other end of said current path of said first transistor and whose gate is connected to said first potential source, a fourth transistor of said second conductivity type whose current path has one end connected to an other end of said current path of said second transistor and an other end connected to an other end of said current path of said third transistor and whose gate is connected to said other end of said first transistor, and a fifth transistor of said second conductivity type whose current path has one end connected to said other ends of said current paths of said third and fourth transistors and an other end connected to a second potential source and whose gate is applied with a frequency control voltage;

a node between said current paths of said first and third transistors is connected to said operational amplifier;

each of said differential delay cells includes a sixth transistor of said first conductivity type whose current path has one end connected to said first potential source and whose gate is applied with said amplitude control voltage, a seventh transistor of said first conductivity type whose current path has one end connected to said first potential source and whose gate is applied with said amplitude control voltage, an eighth transistor of said second conductivity type whose current path has one end connected to an other end of said current path of said sixth transistor, a ninth transistor of said second conductivity type whose current path has one end connected to an other end of said current path of said seventh transistor and an other end connected to an other end of said current path of said eighth transistor, and a tenth transistor of said second conductivity type whose current path has one end connected to said other ends of said current paths of said eighth and ninth transistors and an other end connected to said second potential source and whose gate is applied with said frequency control voltage;

a node between said current paths of said sixth and eighth transistors is connected to a gate of said eighth transistor of a next stage of said differential delay cell, and a node between said current paths of said seventh and ninth transistors is connected to a gate of said ninth transistor of said next stage of said differential delay cell, whereby said differential delay cells are connected in a ring form; and sizes of said first and second transistors are larger than those of said sixth and seventh transistors.

12. A voltage-controlled oscillator comprising a voltage-controlled oscillation section having a plurality of differential delay cells connected in a ring form, and an amplitude controller for controlling an amplitude of a signal output from said voltage-controlled oscillation section, said amplitude controller including,
an amplitude-control target circuit,
a reference voltage generator for generating and outputting a reference voltage for amplitude control, and
an operational amplifier for receiving said reference voltage output from said reference voltage generator and an output voltage of said amplitude-control target circuit and outputting a control voltage for controlling amplitude control sections in said differential delay cells and an amplitude control section in said amplitude-control target circuit in such a way that a potential difference between said reference voltage and said output voltage becomes zero,
each of said differential delay cells having a first amplitude control section and a first current control section and a pair of first and second V/I converting sections connected between said first amplitude control section and said first current control section, differential signals being input to input terminals of said first and second V/I converting sections,
said amplitude-control target circuit having a second amplitude control section and a second current control section and a single third V/I converting section connected between said second amplitude control section and said second current control section, a supply voltage being input to an input terminal of said third V/I converting section.

13. The voltage-controlled oscillator according to claim 10, wherein said amplitude-control target circuit includes a first transistor of a first conductivity type whose current path has one end connected to a first potential source and whose gate is applied with an amplitude control voltage, a second transistor of said first conductivity type whose current path has one end connected to said first potential source and whose gate is applied with said amplitude control voltage, a third transistor of a second conductivity type whose current path has one end connected to an other end of said current path of said first transistor and whose gate is connected to said first potential source, a fourth transistor of said second conductivity type whose current path has one end connected to an other end of said current path of said second transistor and an other end connected to an other end of said current path of said third transistor and whose gate is connected to said other end of said first transistor, and a fifth transistor of said second conductivity type whose current path has one end connected to said other ends of said current paths of said third and fourth transistors and an other end connected to a second potential source and whose gate is applied with a frequency control voltage;

a node between said current paths of said first and third transistors is connected to said operational amplifier;

each of said differential delay cells includes a sixth transistor of said first conductivity type whose current path has one end connected to said first potential source and whose gate is applied with said amplitude control voltage, a seventh transistor of said first conductivity type whose current path has one end connected to said first potential source and whose gate is applied with said amplitude control voltage, an eighth transistor of said second conductivity type whose current path has one end connected to an other end of said current path of said sixth transistor, a ninth transistor of said second conductivity type whose current path has one end connected to an other end of said current path of said seventh transistor and an other end connected to an other end of said current path of said eighth transistor, and a tenth transistor of said second conductivity type whose current path has one end connected to said other ends of said current paths of said eighth and ninth transistors and an other end connected to said second potential source and whose gate is applied with said frequency control voltage; and a node between said current paths of said sixth and eighth transistors is connected to a gate of said eighth transistor of a next stage of said differential delay cell, and a node between said current paths of said seventh and ninth transistors is connected to a gate of said ninth transistor of said next stage of said differential delay cell, whereby said differential delay cells are connected in a ring form.

14. A voltage-controlled oscillator comprising a voltage-controlled oscillation section and an amplitude controller for controlling an amplitude of a signal output from said voltage-controlled oscillation section, said voltage-controlled oscillation section having a plurality of differential delay cells connected in a ring form, each of said differential delay cells including a first amplitude control section, first and second V/I converting sections having input terminals to which differential signals are input, and a first current control section to which output currents of said first and second V/I converting sections are commonly supplied, said amplitude controller including,
an amplitude-control target circuit having a second amplitude control section, a third V/I converting section whose input terminal is applied with a supply voltage and which is controlled by an output of said second amplitude control section, and a second current control section to which an output current of said third V/I converting section is supplied and whose current value is smaller than a current value of said first current control section and greater than ½ thereof,
a reference voltage generator for generating and outputting a reference voltage for amplitude control, and
an operational amplifier for receiving said reference voltage output from said reference voltage generator and an output voltage of said amplitude-control target circuit and outputting an amplitude control voltage for controlling said first amplitude control sections in said differential delay cells and said second amplitude control section in said amplitude-control target circuit in such a way that a potential difference between said reference voltage and said output voltage becomes zero,
wherein a transconductance of said first amplitude control sections of said differential delay cells constituting said voltage-controlled oscillation section is substantially equal to a transconductance of said second amplitude control section of said amplitude-control target circuit with respect to the same control voltage output from said operational amplifier.

15. The voltage-controlled oscillator according to claim 14, wherein said amplitude-control target circuit includes a first transistor of a first conductivity type whose current path has one end connected to a first potential source and whose gate is applied with said amplitude control voltage, a second transistor of a second conductivity type whose current path has one end connected to an other end of said current path of said first transistor and whose gate is connected to said first potential source, and a third transistor of said second conductivity type whose current path has one end connected to an other end of said current path of said second transistor and an other end connected to a second potential source and whose gate is applied with a frequency control voltage;

a node between said current paths of said first and second transistors is connected to said operational amplifier;

each of said differential delay cells includes a fourth transistor of said first conductivity type whose current path has one end connected to said first potential source and whose gate is applied with said amplitude control voltage, a fifth transistor of said first conductivity type whose current path has one end connected to said first potential source and whose gate is applied with said amplitude control voltage, a sixth transistor of said second conductivity type whose current path has one end connected to an other end of said current path of said fourth transistor, a seventh transistor of said second conductivity type whose current path has one end connected to an other end of said current path of said fifth transistor and an other end connected to an other end of said current path of said sixth transistor, and an eighth transistor of said second conductivity type whose current path has one end connected to said other ends of said current paths of said sixth and seventh transistors and an other end connected to said second potential source and whose gate is applied with said frequency control voltage;

a node between said current paths of said fourth and sixth transistors is connected to a gate of said sixth transistor of a next stage of said differential delay cell, and a node between said current paths of said fifth and seventh transistors is connected to a gate of said seventh transistor of said next stage of said differential delay cell, whereby said differential delay cells are connected in a ring form; and a size of said first transistor is smaller than that of said fourth transistor and a size of said third transistor is larger than half a size of said eighth transistor.

16. The voltage-controlled oscillator according to claim 14, wherein said amplitude-control target circuit includes a first transistor of a first conductivity type whose current path has one end connected to a first potential source, a second transistor of said first conductivity type whose current path has one end connected to said first potential source and an other end connected to an other end of said current path of said first transistor and a gate thereof, and whose gate is applied with said amplitude control voltage, a third transistor of a second conductivity type whose current path has one end connected to said other ends of said current paths of said first and second transistors and whose gate is connected to said first potential source, and a fourth transistor of said second conductivity type whose current path has one end connected to an other end of said current path of said third transistor and an other end connected to a second potential source and whose gate is applied with a frequency control voltage;

a node between said current paths of said second and third transistors is connected to said operational amplifier;

each of said differential delay cells includes a fifth transistor of said first conductivity type whose current path has one end connected to said first potential source and whose gate is applied with said amplitude control voltage, a sixth transistor of said first conductivity type whose current path has one end connected to said first potential source and whose gate is applied with said amplitude control voltage, a seventh transistor of said second conductivity type whose current path has one end connected to an other end of said current path of said fifth transistor, an eighth transistor of said second conductivity type whose current path has one end connected to an other end of said current path of said sixth transistor and an other end connected to an other end of said current path of said seventh transistor, a ninth transistor of said second conductivity type whose current path has one end connected to said other ends of said current paths of said seventh and eighth transistors and an other end connected to said second potential source and whose gate is applied with said frequency control voltage, a tenth transistor of said first conductivity type whose current path has one end connected to said first potential source and an other end connected to a node between said current paths of said fifth and seventh transistors and whose gate is also connected to said node between said current paths of said fifth and seventh transistors, and an eleventh transistor of said first conductivity type whose current path has one end connected to said first potential source and an other end connected to a node between said current paths of said sixth and eighth transistors and whose gate is also connected to said node between said current paths of said sixth and eighth transistors;

said node between said current paths of said fifth and seventh transistors is connected to a gate of said seventh transistor of a next stage of said differential delay cell, and said node between said current paths of said sixth and eighth transistors is connected to a gate of said eighth transistor of said next stage of said differential delay cell, whereby said differential delay cells are connected in a ring form; and a size of said second transistor is smaller than that of one of said fifth and sixth transistors and a size of said fourth transistor is larger than half a size of said ninth transistor.

17. The voltage-controlled oscillator according to claim 14, wherein said amplitude-control target circuit includes a first transistor of a second conductivity type whose current path has one end connected to a first potential source and whose gate is also connected to said first potential source, a second transistor of said first conductivity type whose current path has one end connected to said first potential source and an other end connected to an other end of said current path of said first transistor and whose gate is applied with said amplitude control voltage, a third transistor of a second conductivity type whose current path has one end connected to said other ends of said current paths of said first and second transistors and whose gate is connected to said first potential source, and a fourth transistor of said second conductivity type whose current path has one end connected to an other end of said current path of said third transistor and an other end connected to a second potential source and whose gate is applied with a frequency control voltage;

a node between said current paths of said second and third transistors is connected to said operational amplifier;

each of said differential delay cells includes a fifth transistor of said first conductivity type whose current path has one end connected to said first potential source and whose gate is applied with said amplitude control voltage, a sixth transistor of said first conductivity type whose current path has one end connected to said first potential source and whose gate is applied with said amplitude control voltage, a seventh transistor of said second conductivity type whose current path has one end connected to an other end of said current path of said fifth transistor, an eighth transistor of said second conductivity type whose current path has one end connected to an other end of said current path of said sixth transistor and an other end connected to an other end of said current path of said seventh transistor, a ninth transistor of said second conductivity type whose current path has one end connected to said other ends of said current paths of said seventh and eighth transistors and an other end connected to said second potential source and whose gate is applied with said frequency control voltage, a tenth transistor of said second conductivity type whose current path has one end connected to said first potential source and an other end connected to a node between said current paths of said fifth and seventh transistors and whose gate is also connected to said first potential source, and an eleventh transistor of said second conductivity type whose current path has one end connected to said first potential source and an other end connected to a node between said current paths of said sixth and eighth transistors and whose gate is also connected to said first potential source;

said node between said current paths of said fifth and seventh transistors is connected to a gate of said seventh transistor of a next stage of said differential delay cell, and said node between said current paths of said sixth and eighth transistors is connected to a gate of said eighth transistor of said next stage of said differential delay cell, whereby said differential delay cells are connected in a ring form; and a size of said second transistor is smaller than that of one of said fifth and sixth transistors and a size of said fourth transistor is larger than half a size of said ninth transistor.

18. A voltage-controlled oscillator comprising a voltage-controlled oscillation section and an amplitude controller for controlling an amplitude of a signal output from said voltage-controlled oscillation section, said voltage-controlled oscillation section having a plurality of differential delay cells connected in a ring form, each of said differential delay cells including a first amplitude control section, first and second V/I converting sections having input terminals to which differential signals are input, and a first current control section to which output currents of said first and second V/I converting sections are commonly supplied, said amplitude controller including,
an amplitude-control target circuit having a second amplitude control section, a third V/I converting section whose input terminal is applied with a supply voltage and which is controlled by an output of said second amplitude control section, and a second current control section to which an output current of said third V/I converting section is supplied and whose current value is substantially ½ of a current value of said first current control section,
a reference voltage generator for generating and outputting a reference voltage for amplitude control, and
an operational amplifier for receiving said reference voltage output from said reference voltage generator and an output voltage of said amplitude-control target circuit and outputting an amplitude control voltage for controlling said first amplitude control sections in said differential delay cells and said second amplitude control section in said amplitude-control target circuit in such a way that a potential difference between said reference voltage and said output voltage becomes zero,
wherein a transconductance of said second amplitude control section of said amplitude-control target circuit is smaller than a transconductance of said first amplitude control sections of said differential delay cells constituting said voltage-controlled oscillation section with respect to the same control voltage output from said operational amplifier.

19. The voltage-controlled oscillator according to claim 18, wherein said amplitude-control target circuit includes a first transistor of a first conductivity type whose current path has one end connected to a first potential source and whose gate is applied with said amplitude control voltage, a second transistor of a second conductivity type whose current path has one end connected to an other end of said current path of said first transistor and whose gate is connected to said first potential source, and a third transistor of said second conductivity type whose current path has one end connected to an other end of said current path of said second transistor and an other end connected to a second potential source and whose gate is applied with a frequency control voltage;

a node between said current paths of said first and second transistors is connected to said operational amplifier;

each of said differential delay cells includes a fourth transistor of said first conductivity type whose current path has one end connected to said first potential source and whose gate is applied with said amplitude control voltage, a fifth transistor of said first conductivity type whose current path has one end connected to said first potential source and whose gate is applied with said amplitude control voltage, a sixth transistor of said second conductivity type whose current path has one end connected to an other end of said current path of said fourth transistor, a seventh transistor of said second conductivity type whose current path has one end connected to an other end of said current path of said fifth transistor and an other end connected to an other end of said current path of said sixth transistor, and an eighth transistor of said second conductivity type whose current path has one end connected to said other ends of said current paths of said sixth and seventh transistors and an other end connected to said second potential source and whose gate is applied with said frequency control voltage;

a node between said current paths of said fourth and sixth transistors is connected to a gate of said sixth transistor of a next stage of said differential delay cell, and a node between said current paths of said fifth and seventh transistors is connected to a gate of said seventh transistor of said next stage of said differential delay cell, whereby said differential delay cells are connected in a ring form; and a size of said first transistor is smaller than that of said fourth transistor and a size of said third transistor is larger than half a size of said eighth transistor.

20. The voltage-controlled oscillator according to claim 18, wherein said amplitude-control target circuit includes a first transistor of a first conductivity type whose current path has one end connected to a first potential source, a second transistor of said first conductivity type whose current path has one end connected to said first potential source and an other end connected to an other end of said current path of said first transistor and a gate thereof, and whose gate is applied with said amplitude control voltage, a third transistor of a second conductivity type whose current path has one end connected to said other ends of said current paths of said first and second transistors and whose gate is connected to said first potential source, and a fourth transistor of said second conductivity type whose current path has one end connected to an other end of said current path of said third transistor and an other end connected to a second potential source and whose gate is applied with a frequency control voltage;

a node between said current paths of said second and third transistors is connected to said operational amplifier;

each of said differential delay cells includes a fifth transistor of said first conductivity type whose current path has one end connected to said first potential source and whose gate is applied with said amplitude control voltage, a sixth transistor of said first conductivity type whose current path has one end connected to said first potential source and whose gate is applied with said amplitude control voltage, a seventh transistor of said second conductivity type whose current path has one end connected to an other end of said current path of said fifth transistor, an eighth transistor of said second conductivity type whose current path has one end connected to an other end of said current path of said sixth transistor and an other end connected to an other end of said current path of said seventh transistor, a ninth transistor of said second conductivity type whose current path has one end connected to said other ends of said current paths of said seventh and eighth transistors and an other end connected to said second potential source and whose gate is applied with said frequency control voltage, a tenth transistor of said first conductivity type whose current path has one end connected to said first potential source and an other end connected to a node between said current paths of said fifth and seventh transistors and whose gate is also connected to said node between said current paths of said fifth and seventh transistors, and an eleventh transistor of said first conductivity type whose current path has one end connected to said first potential source and an other end connected to a node between said current paths of said sixth and eighth transistors and whose gate is also connected to said node between said current paths of said sixth and eighth transistors;

said node between said current paths of said fifth and seventh transistors is connected to a gate of said seventh transistor of a next stage of said differential delay cell, and said node between said current paths of said sixth and eighth transistors is connected to a gate of said eighth transistor of said next stage of said differential delay cell, whereby said differential delay cells are connected in a ring form; and a size of said second transistor is smaller than that of one of said fifth and sixth transistors and a size of said fourth transistor is larger than half a size of said ninth transistor.

21. The voltage-controlled oscillator according to claim 18, wherein said amplitude-control target circuit includes a first transistor of a second conductivity type whose current path has one end connected to a first potential source and whose gate is also connected to said first potential source, a second transistor of said first conductivity type whose current path has one end connected to said first potential source and an other end connected to an other end of said current path of said first transistor and whose gate is applied with said amplitude control voltage, a third transistor of a second conductivity type whose current path has one end connected to said other ends of said current paths of said first and second transistors and whose gate is connected to said first potential source, and a fourth transistor of said second conductivity type whose current path has one end connected to an other end of said current path of said third transistor and an other end connected to a second potential source and whose gate is applied with a frequency control voltage;

a node between said current paths of said second and third transistors is connected to said operational amplifier;

each of said differential delay cells includes a fifth transistor of said first conductivity type whose current path has one end connected to said first potential source and whose gate is applied with said amplitude control voltage, a sixth transistor of said first conductivity type whose current path has one end connected to said first potential source and whose gate is applied with said amplitude control voltage, a seventh transistor of said second conductivity type whose current path has one end connected to an other end of said current path of said fifth transistor, an eighth transistor of said second conductivity type whose current path has one end connected to an other end of said current path of said sixth transistor and an other end connected to an other end of said current path of said seventh transistor, a ninth transistor of said second conductivity type whose current path has one end connected to said other ends of said current paths of said seventh and eighth transistors and an other end connected to said second potential source and whose gate is applied with said frequency control voltage, a tenth transistor of said second conductivity type whose current path has one end connected to said first potential source and an other end connected to a node between said current paths of said fifth and seventh transistors and whose gate is also connected to said first potential source, and an eleventh transistor of said second conductivity type whose current path has one end connected to said first potential source and an other end connected to a node between said current paths of said sixth and eighth transistors and whose gate is also connected to said first potential source;

said node between said current paths of said fifth and seventh transistors is connected to a gate of said seventh transistor of a next stage of said differential delay cell, and said node between said current paths of said sixth and eighth transistors is connected to a gate of said eighth transistor of said next stage of said differential delay cell, whereby said differential delay cells are connected in a ring form; and a size of said second transistor is smaller than that of one of said fifth and sixth transistors and a size of said fourth transistor is larger than half a size of said ninth transistor.

22. A voltage-controlled oscillator comprising an output level converting circuit which includes:

a small-amplitude output and low-gain input differential stage for receiving and amplifying a small-amplitude output signal of a voltage-controlled oscillation section comprised of differential delay cells;

an output level adjusting circuit for adjusting a DC level of an output of said small-amplitude output and low-gain input differential stage;

a common-mode feedback amplifying stage for receiving an output of said small-amplitude output and low-gain input differential stage whose output level has been adjusted and amplifying said received output to an output of a CMOS level; and a CMOS buffer amplifying stage for receiving an output of said common feedback amplifying stage and outputting a waveform-shaped output signal.

23. The voltage-controlled oscillator according to claim 22, wherein said small-amplitude output and low-gain input differential stage includes a first transistor of a first conductivity type whose current path has one end connected to a first potential source, a second transistor of said first conductivity type whose current path has one end connected to said first potential source, a third transistor of a second conductivity type whose current path has one end connected to an other end of said current path of said first transistor and a gate thereof and whose gate is supplied with a first input signal, a fourth transistor of said second conductivity type whose current path has one end connected to an other end of said current path of said second transistor and a gate thereof and an other end connected to an other end of said third transistor, and whose gate is supplied with a second input signal, and a fifth transistor of said second conductivity type whose current path has one end connected to said other ends of said current paths of said third and fourth transistors and an other end connected to a second potential source and whose gate is supplied with a control voltage.

24. The voltage-controlled oscillator according to claim 23, wherein said output level adjusting circuit includes a sixth transistor of said second conductivity type whose current path has one end connected to a node between said current paths of said first and third transistors, a seventh transistor of said second conductivity type whose current path has one end connected to a node between said current paths of said second and fourth transistors, an eighth transistor of said second conductivity type whose current path has one end connected to other ends of said current paths of said sixth and seventh transistors and an other end connected to said second potential source and whose gate is connected to said node between said current paths of said first and third transistors, a ninth transistor of said second conductivity type whose current path has one end connected to said other ends of said current paths of said sixth and seventh transistors and an other end connected to said second potential source and whose gate is connected to said node between said current paths of said second and fourth transistors, a tenth transistor of said first conductivity type whose current path has one end connected to said first potential source and whose gate is connected to gates of said sixth and seventh transistors, an eleventh transistor of said second conductivity type whose current path has one end connected to an other end of said current path of said tenth transistor and said gate thereof and whose gate is connected to said gates of said sixth and seventh transistors, and a twelfth transistor of said second conductivity type whose current path has one end connected to an other end of said current path of said eleventh transistor and an other end connected to said second potential source and whose gate is supplied with said control voltage.

25. The voltage-controlled oscillator according to claim 24, wherein said common-mode feedback amplifying stage includes a thirteenth transistor of said first conductivity type whose current path has one end connected to said first potential source, a fourteenth transistor of said first conductivity type whose current path has one end connected to said first potential source and an other end connected to an other end of said current path of said thirteenth transistor, a fifteenth transistor of said first conductivity type whose current path has one end connected to said other end of said current path of said thirteenth transistor and whose gate is connected to said node between said current paths of said first and third transistors, a sixteenth transistor of said first conductivity type whose current path has one end connected to an other end of said current path of said fourteenth transistor and whose gate is connected to said node between said current paths of said second and fourth transistors, a seventeenth transistor of said second conductivity type whose current path has one end connected to an other end of said current path of said fifteenth transistor and said gate of said thirteenth transistor and an other end connected to said second potential source, and an eighteenth transistor of said second conductivity type whose current path has one end connected to an other end of said current path of said sixteenth transistor and an other end connected to said second potential source and whose gate is connected to said gate of said seventeenth transistor and said other end of said current path of said fifteenth transistor.

26. The voltage-controlled oscillator according to claim 25, further including a nineteenth transistor of said first conductivity type whose current path has one end connected to said first potential source and whose gate is connected to a node between said current paths of said sixteenth and eighteenth transistors, a twentieth transistor of said second conductivity type whose current path has one end connected to an other end of said current path of said nineteenth transistor and an other end connected to said second potential source and whose gate is connected to said node between said current paths of said sixteenth and eighteenth transistors, a twenty-first transistor of said first conductivity type whose current path has one end connected to said first potential source and whose gate is connected to a node between said current paths of said nineteenth and twentieth transistors, and a twenty-second transistor of said second conductivity type whose current path has one end connected to an other end of said current path of said twenty-first transistor and an other end connected to said second potential source and whose gate is connected to said node between said current paths of said nineteenth and twentieth transistors.

27. The voltage-controlled oscillator according to claim 26, wherein said small-amplitude output and low-gain input differential stage further includes a twenty-third transistor of said second conductivity type whose current path has one end connected to said first potential source and whose gate is also connected to said first potential source, a twenty-fourth transistor of said second conductivity type whose current path has one end connected to said first potential source and whose gate is also connected to said first potential source, a twenty-fifth transistor of said second conductivity type whose current path has one end connected to an other end of said current path of said twenty-third transistor and whose gate is supplied with said first input signal, a twenty-sixth transistor of said second conductivity type whose current path has one end connected to an other end of said current path of said twenty-fourth transistor and an other end connected to an other end of said current path of said twenty-fifth transistor and whose gate is supplied with said second input signal, and a twenty-seventh transistor of said second conductivity type whose current path has one end connected to said other ends of said current paths of said twenty-fifth and twenty-sixth transistors and an other end connected to said second potential source and whose gate is supplied with said control voltage.

* * * * *